(12) United States Patent
Park et al.

(10) Patent No.: US 10,808,174 B2
(45) Date of Patent: Oct. 20, 2020

(54) PROCESS FOR PREPARING A QUANTUM DOT, A QUANTUM DOT PREPARED THEREFROM, AND AN ELECTRONIC DEVICE INCLUDING THE SAME

(71) Applicants: SAMSUNG ELECTRONICS CO., LTD., Suwon-si, Gyeonggi-do (KR); Samsung Display Co., Ltd., Yongin-si, Gyeonggi-do (KR); SAMSUNG SDI CO., LTD., Yongin-si, Gyeonggi-do (KR)

(72) Inventors: Young Seok Park, Yongin-si (KR); Shang Hyeun Park, Yongin-si (KR); Eun Joo Jang, Suwon-si (KR); Hyo Sook Jang, Suwon-si (KR); Shin Ae Jun, Seongnam-si (KR); Dae Young Chung, Suwon-si (KR); Taekhoon Kim, Hwaseong-si (KR); Yuho Won, Seoul (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 376 days.

(21) Appl. No.: 15/855,436

(22) Filed: Dec. 27, 2017

(65) Prior Publication Data

US 2018/0179441 A1 Jun. 28, 2018

(30) Foreign Application Priority Data

Dec. 27, 2016 (KR) .......... 10-2016-0180123

(51) Int. Cl.
| | | |
|---|---|---|
| *C09K 11/88* | (2006.01) | |
| *C09K 11/02* | (2006.01) | |
| *H01L 51/00* | (2006.01) | |
| *G02B 5/22* | (2006.01) | |
| *H01L 27/32* | (2006.01) | |
| *B82Y 40/00* | (2011.01) | |
| *H01L 51/50* | (2006.01) | |
| *B82Y 30/00* | (2011.01) | |

(52) U.S. Cl.
CPC .......... *C09K 11/883* (2013.01); *C09K 11/025* (2013.01); *G02B 5/22* (2013.01); *G02B 5/223* (2013.01); *H01L 27/322* (2013.01); *H01L 51/0035* (2013.01); *H01L 51/0037* (2013.01); *H01L 51/0039* (2013.01); *B82Y 30/00* (2013.01); *B82Y 40/00* (2013.01); *H01L 51/502* (2013.01); *Y10S 977/774* (2013.01); *Y10S 977/818* (2013.01); *Y10S 977/824* (2013.01); *Y10S 977/892* (2013.01); *Y10S 977/896* (2013.01); *Y10S 977/95* (2013.01)

(58) Field of Classification Search
CPC . C09K 11/883; C09K 11/025; Y10S 977/774; Y10S 977/818; Y10S 977/824; Y10S 977/892; Y10S 977/896; Y10S 977/95
See application file for complete search history.

(56) References Cited

U.S. PATENT DOCUMENTS

| | | | | |
|---|---|---|---|---|
| 9,284,484 B2 * | 3/2016 | Jang | .................. | C30B 29/60 |
| 2010/0159249 A1 | 6/2010 | Jang et al. | | |
| 2015/0083969 A1 * | 3/2015 | Kim | .................. | C09K 11/025 |
| | | | | 252/301.6 S |
| 2015/0218442 A1 | 8/2015 | Jun et al. | | |

FOREIGN PATENT DOCUMENTS

| | | |
|---|---|---|
| KR | 1020100071696 A | 6/2010 |
| KR | 101517094 B1 | 4/2015 |
| KR | 101525524 B1 | 5/2015 |
| KR | 101525525 B1 | 5/2015 |
| WO | 2015002995 A1 | 1/2015 |

* cited by examiner

*Primary Examiner* — C Melissa Koslow
(74) *Attorney, Agent, or Firm* — Cantor Colburn LLP

(57) ABSTRACT

A process for preparing a quantum dot of a core-shell structure including obtaining a first mixture including first precursor including a first metal, a ligand compound, and a solvent; adding a second precursor and a particle including a first semiconductor nanocrystal to the first mixture to obtain a second mixture; and heating the second mixture up to a reaction temperature and performing a reaction between the first precursor and the second precursor to form a layer of a shell including a crystalline or amorphous material, during formation of the layer of the shell or after formation of the layer of the shell, wherein the process includes adding an organic solution including an ammonium fluorinated salt including a solid salt having a melting point of greater than or equal to about 110° C. to the second mixture.

24 Claims, 9 Drawing Sheets

Pattern Preparation by using a photoresist

Repeating the Patterning Process three times

PROCESS FOR PREPARING A QUANTUM DOT, A QUANTUM DOT PREPARED THEREFROM, AND AN ELECTRONIC DEVICE INCLUDING THE SAME

CROSS-REFERENCE TO RELATED APPLICATION

This application claims priority to Korean Patent Application No. 10-2016-0180123, filed in the Korean Intellectual Property Office on Dec. 27, 2016, and all the benefits accruing therefrom under 35 U.S.C. § 119, the content of which is incorporated herein in its entirety by reference.

BACKGROUND

1. Field

A process for preparing a quantum dot, a quantum dot prepared therefrom, and an electronic device including the same are disclosed.

2. Description of the Related Art

Physical characteristics (e.g., energy bandgaps and melting points) of nanoparticles that are known as intrinsic characteristics may be controlled by changing their particle size, unlike bulk materials. For example, semiconductor nanocrystal particles also known as quantum dots include a semiconductor material having a crystalline structure with a size of several nanometers. Such semiconductor nanocrystal particles exhibit quantum confinement effects, and thus have different physicochemical characteristics from the characteristics of bulk materials having the same composition. That is, nanocrystals may exhibit various characteristics by controlling their physical sizes. Quantum dots may be excited by absorb light from an excitation source, and may emit energy corresponding to its energy bandgap.

A semiconductor nanocrystal may be synthesized in a vapor deposition method of metal organic chemical vapor deposition ("MOCVD"), molecular beam epitaxy ("MBE"), and the like, a wet chemical method of adding a precursor material to an organic solvent to grow crystals, and the like. In the wet chemical method, since an organic material such as a dispersing agent may be coordinated on a surface of a semiconductor crystal to control a crystal growth during the crystal growth, uniformity of sizes and shapes of nanocrystal may be easily controlled by a vapor deposition method.

Because a quantum dot has very small size, a surface area per unit volume is very wide compared to a bulk crystal material, and thus a structure including a core and an inorganic shell has been suggested in order to improve light emitting characteristics and stability. However, there is a need for improvement of qualities (e.g., luminous efficiency, chemical/thermal stability, etc.) of the quantum dot having a core-shell structure.

SUMMARY

An embodiment provides a process for preparing a quantum dot having improved quality.

An embodiment provides a quantum dot prepared by the preparation process.

An embodiment provides a quantum dot-polymer composite including the quantum dot.

An embodiment provides an electronic device including the quantum dot.

In an embodiment, a process for preparing a quantum dot includes obtaining a first mixture including first precursor including a first metal, a ligand compound, and a solvent;

adding a second precursor and a particle including a first semiconductor nanocrystal to the first mixture to obtain a second mixture; and heating the second mixture to a reaction temperature to cause a reaction between the first precursor and the second precursor to form a layer of a shell including a crystalline or amorphous material, wherein the process includes adding an organic solution including an ammonium fluorinated salt ammonium fluorinated salt and optionally a metal salt to the second mixture at least one of during formation of the layer of the shell and after formation of the layer of the shell, the ammonium fluorinated salt includes a solid salt having a melting point of greater than or equal to about 110° C., and the optional metal salt includes a transition metal that is different from the first metal of the first precursor.

The first semiconductor nanocrystal may include a Group II-VI compound, a Group III-V compound, a Group IV-VI compound, a Group IV element or compound, a Group I-III-VI compound, a Group I-II-IV-VI compound, or a combination thereof.

The crystalline or amorphous material may include a Group II-VI compound, a Group III-V compound, a Group IV-VI compound, a Group IV compound, a metal-containing halogen compound, a metal oxide, or a combination thereof.

The first precursor may include a Group II metal, a Group III metal, a Group IV metal, or a combination thereof, and may be a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

The second precursor may include a Group V element or a compound including the same, a Group VI element or a compound including the same, a halogen-containing compound, or a combination thereof.

The ligand compound may be RCOOH, RNH$_2$, R$_2$NH, R$_3$N, RSH, R$_3$PO, R$_3$P, ROH, RCOOR', RPO(OH)$_2$, R$_2$POOH (wherein, R and R' are the same or different, and are independently a substituted or unsubstituted C1 to C24 aliphatic hydrocarbon group or a substituted or unsubstituted C6 to C20 aromatic hydrocarbon group), or a combination thereof.

The method may further include heating the first mixture to a temperature that is lower than the reaction temperature.

In the method, the organic solution may be added to the second mixture at a temperature that is lower than the reaction temperature.

The ammonium fluorinated salt may include an alkyl ammonium fluorophosphates. The ammonium fluorinated salt may be represented by Chemical Formula 1:

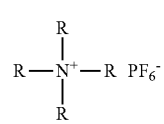

Chemical Formula 1 wherein, each R is the same or different and is independently a C1 to C16 aliphatic hydrocarbon group or a C6 to C20 (e.g., C6 or C7) aromatic hydrocarbon group, and optionally at least two of the R are linked with each other to form a ring.

The ammonium fluorinated salt may include a symmetric tetraalkyl ammonium salt, an asymmetric tetraalkylammonium salt, an aryltrialkyl ammonium salt, or a combination thereof.

The ammonium fluorinated salt may include tetramethylammonium hexafluorophosphate, tetraethylammonium hexafluorophosphate, tetrapropylammonium hexafluorophosphate, tetrabutylammonium hexafluorophosphate, tetrahexylammonium hexafluorophosphate, ethyltrimethylammonium hexafluorophosphate, benzyltrimethylammonium hexafluorophosphate, dodecyltrimethylammonium hexafluorophosphate, hexadecyltrimethylammonium hexafluorophosphate, or a combination thereof.

An amount of the ammonium fluorinated salt may be about 0.0001 mole to about 100 moles with respect to one mole of the first precursor.

The metal salt may include a compound represented by Chemical Formula 2:

$$M^+X^-$$  Chemical Formula 2 wherein, M is zirconium, hafnium, aluminum, or a combination thereof, and X is a C1 to C10 alkoxide, $RCOCH_2COR^-$ (wherein, each R is the same or different and is independently a C1 to C10 aliphatic hydrocarbon group or a C6 to C20 aromatic hydrocarbon group), or a C1 to C18 carboxylate.

A content of the metal salt may be about 0.001 mole to about 100 moles with respect to one mole of the first precursor.

The organic solution may include a C3 to C12 ketone, a C1 to C24 amine, a C1 to C12 alcohol, a C4 to C9 nitrogen-containing heterocyclic compound, a C6 to C18 substituted or unsubstituted aliphatic hydrocarbon, a C6 to C14 substituted or unsubstituted aromatic hydrocarbon, a C2 to C8 nitrile, or a combination thereof.

The forming of the layer of the shell may be performed at least twice to form a multi-layered shell including at least two layers and the first precursor, the second precursor, the ammonium fluorinated salt, the metal salt, or a combination thereof may be changed during formation of each layer so that two adjacent layers may have different compositions.

In the process, the organic solution may be added to the second mixture during formation of an outermost layer of the multi-layered shell.

In an embodiment, a quantum dot includes a core including a first semiconductor nanocrystal and a shell disposed on the core and including a crystalline or amorphous material, wherein the shell includes phosphorus, fluorine, and optionally a transition metal, the transition metal includes zirconium, hafnium, aluminum, or a combination thereof, the phosphorus and the transition metal are present as being doped, and the fluorine is present as being doped or in a form of a fluoride.

The first semiconductor nanocrystal may include a Group II-VI compound, a Group III-V compound, a Group IV-VI compound, a Group IV element or compound, a Group I-III-VI compound, a Group I-II-IV-VI compound, or a combination thereof.

The crystalline or amorphous material may include a Group III-VI compound, a Group III-V compound, a Group IV-VI compound, a Group IV compound, a metal-containing halogen compound, a metal oxide, or a combination thereof.

The crystalline or amorphous material may include a different compound from the first semiconductor nanocrystal.

The phosphorus, the fluorine, and optionally, the transition metal may be bound to a surface of the quantum dot, and in this case, an X-ray diffraction spectrum of the quantum dot may not exhibit crystalline peaks arising from the presence of the phosphorus, the fluorine, and optionally the transition metal.

Presence of the phosphorus, the fluorine, and optionally the transition metal may be confirmed in an energy dispersive X ray spectroscopy of the quantum dot.

The quantum dot may include a ligand compound on a surface of the quantum dot and the ligand compound may include $RCOOH$, $RNH_2$, $R_2NH$, $R_3N$, $RSH$, $R_3PO$, $R_3P$, $ROH$, $RCOOR'$, $RPO(OH)_2$, $R_2POOH$ (wherein, R and R' are the same or different, and are independently a substituted or unsubstituted C1 to C24 aliphatic hydrocarbon group or a substituted or unsubstituted C6 to C20 aromatic hydrocarbon group), or a combination thereof.

In an embodiment, a quantum dot polymer composite includes a polymer matrix; and the quantum dot dispersed in the polymer matrix.

The polymer matrix may include a cross-linked polymer and a linear polymer having a carboxylic acid-containing repeating unit (carboxylic acid polymer).

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof.

In the carboxylic acid polymer, the carboxylic acid-containing repeating unit may be derived from a monomer including a carboxylic acid group and a carbon-carbon double bond, a monomer having a dianhydride moiety, or a combination thereof.

An embodiment provides an electronic device including the quantum dot.

The electronic device may include a quantum dot light emitting diode, an organic light emitting diode, a sensor, a solar cell, an image sensor, or a liquid crystal display.

The process according to an embodiment may improve properties of a quantum dot having a core-shell structure by using a relatively small amount of a salt compound without having an adverse effect on dispersion stability of a synthesized quantum dot solution and with a reduced number of process steps and thereby a surface of a shell layer of the quantum dot may be modified with fluorine, phosphorus, and optionally, a transition metal.

The quantum dot having the modified surface with fluorine, phosphorus, and optionally, a transition metal in the above process may show improved properties (e.g., light emitting properties or electrical properties) and stability (e.g., chemical and thermal stability).

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
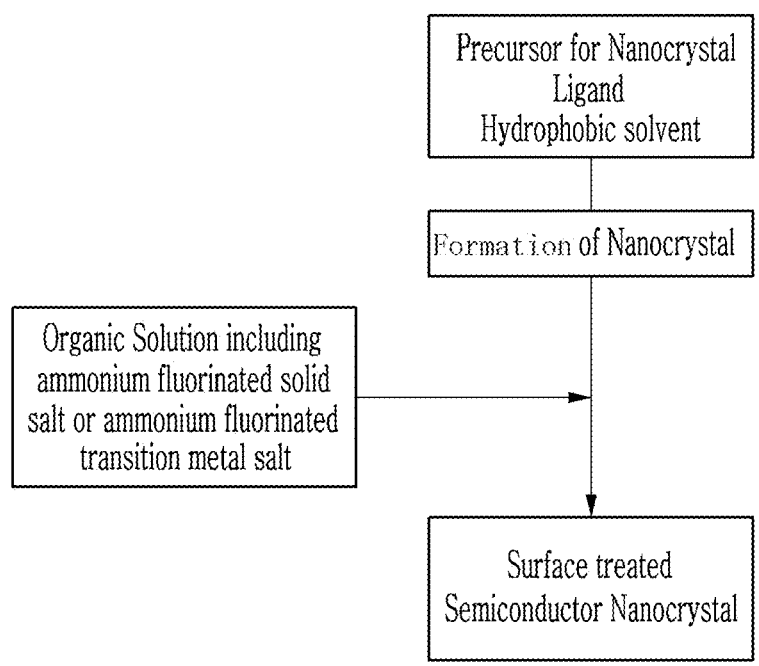
FIG. 1 is a flow chart showing an exemplary embodiment of a process for preparing a quantum dot.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, as used herein, when a definition is not otherwise provided, "substituted" refers to the case where hydrogen of a compound is substituted with a substituent comprising a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$^2$) or a salt thereof (—PO$_3$MH or —PO$_3$M$_2$, wherein M is an organic or inorganic cation), or a combination thereof.

As used herein, "monovalent organic functional group" refers to a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, "hetero" refers to one including 1 to 3 heteroatoms comprising N, O, S, Si, or P.

As used herein, "alkylene group" may refer to a straight or branched saturated aliphatic hydrocarbon group having a valence of at least two, optionally substituted with one or more substituents. As used herein, "arylene group" may refer to a functional group having a valence of at least two obtained by removal of two hydrogens in an aromatic ring, optionally substituted with one or more substituents.

As used herein, "aliphatic organic group" refers to a C1 to C30 linear or branched alkyl group, "aromatic organic group" refers to a C6 to C30 aryl group or a C2 to C30 heteroaryl group, and "alicyclic organic group" refers to a C3 to C30 cycloalkyl group, a C3 to C30 cycloalkenyl group, and a C3 to C30 cycloalkynyl group.

As used herein, "(meth)acrylate" refers to acrylate and/or methacrylate.

As used herein, a blue light conversion rate refers to a ratio of emission light relative to incident light. For example, a blue light conversion rate is a ratio of a light emission dose of a quantum dot composite relative to absorbed light dose of the quantum dot composite from excited light (i.e., blue light). The total light dose (B) of excited light is obtained by integrating a PL spectrum, the PL spectrum of the quantum dot composite film is measured, a dose (A) of light in a green or red wavelength emitted from the quantum dot composite film and a dose (B') of blue light are obtained and, and a blue light conversion rate is obtained by the following equation:

$$A/(B-B')\times 100 = \text{light conversion rate (\%)}$$

In the present specification, "doping" refers to inclusion inside a structure of a corresponding atom without changes of a crystal structure of a semiconductor nanocrystal. For example, the corresponding atom (e.g., phosphorus, fluorine, or a transition metal) may be substitute into the corresponding crystal structure or may be present as an interstice atom of the crystal lattice. The doped atom may not exhibit substantially crystalline peaks in an X-ray diffraction spectrum and may be confirmed by X ray photoelectron spectroscopy, energy dispersive X ray spectroscopy, or ICP-AES.

As used herein, "Group" refers to a Group of Periodic Table.

As used herein, "Group II" may refer to Group IIA and a Group IIB, and examples of the Group II metal include Cd, Zn, Hg, and Mg, but are not limited thereto.

"Group III" may refer to a Group IIIA and a Group IIIB, and examples of the Group III metal include Al, In, Ga, and Tl, but are not limited thereto.

"Group IV" may refer to a Group IVA and a Group IVB, and examples of the Group IV metal include Si, Ge, and Sn, but are not limited thereto. As used herein, "a metal" may include a semi-metal (or metalloid) such as Si.

"Group I" may refer to a Group IA and a Group IB, and may include Li, Na, K, Rb, and Cs, but is not limited thereto.

"Group V" may refer to a Group VA, and may include nitrogen, phosphorus, arsenic, antimony, and bismuth but is not limited thereto.

"Group VI" may refer to a Group VIA, and may include selenium and tellurium but is not limited thereto.

A process for preparing a quantum dot according to an embodiment provides a quantum dot having a core-shell structure including a particle (e.g., a core) including a first semiconductor nanocrystal and a shell disposed on the particle (e.g., surrounding at least a portion or an entire surface thereof).

The process includes obtaining a first mixture including first precursor including a first metal, a ligand compound, and a solvent; optionally heating the first mixture; adding a second precursor and a particle including a first semiconductor nanocrystal to the (optionally heated) first mixture to obtain a second mixture; and heating the second mixture up to a reaction temperature and performing a reaction between the first precursor and the second precursor to form a layer of a shell including a crystalline or amorphous material, wherein an organic solution including an ammonium fluorinated salt and optionally a metal salt is added to the second mixture during formation of the layer of the shell. The ammonium fluorinated salt may include a solid salt having a melting point of greater than or equal to about 110° C., for example, greater than or equal to about 120° C., greater than or equal to about 130° C., greater than or equal to about 140° C., or greater than or equal to about 150° C. and the metal salt includes a transition metal that is different from the first metal of the first precursor.

The first precursor and the second precursor may each independently be at least two types of compounds. When at least two types of compounds are used (e.g., for the first precursor and/or the second precursor), each compound may be added to the (optionally heated) first mixture (at the same or different temperature) simultaneously or with a predetermined time lag. The first precursor may be mixed with a ligand and/or a solvent (e.g., different types of the ligands and/or the solvents) for example, at different ratios depending on the composition to prepare a first mixture, which is then added separately thereto.

The first precursor may include a Group II metal, a Group III metal, a Group IV metal, or a combination thereof, and may be in the form of a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof.

Examples of the first precursor include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, trimethyl gallium, triethylgallium, gallium acetylacetonate, gallium-3-chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, and thallium carbonate, but are not limited thereto. The first precursor may be used alone or in a combination of two or more compounds depending on the composition of a nanocrystal sought to be prepared.

The ligand compound may include any known ligand compound and is not particularly limited. For example, the ligand compound may include RCOOH, $RNH_2$, $R_2NH$, $R_3N$, RSH, $R_3PO$, $R_3P$, ROH, RCOOR', $RPO(OH)_2$, $R_2POOH$ (wherein, R and R' are the same or different, and are independently substituted or unsubstituted C1 to C24 aliphatic hydrocarbon group or a substituted or unsubstituted C6 to C20 aromatic hydrocarbon group), or a combination thereof. The ligand compound may coordinate to a surface of a nanocrystal as prepared and may allow the prepared nanocrystals to be dispersed well in a solution and may have an effect on light emission and electrical characteristics. Examples of the ligand compound include methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid; a phosphine such as methyl phosphine, ethyl phosphine, propyl phosphine, butyl phosphine, or pentyl phosphine; a phosphine oxide such as methyl phosphine oxide, ethyl phosphine oxide, propyl phosphine oxide, or butyl phosphine oxide; a diphenyl phosphine or an oxide compound thereof; a triphenyl phosphine compound or an oxide compound thereof; or phosphonic acid, but is not limited thereto. The organic ligand compound may be used alone or as a mixture of two or more compounds.

The solvent may comprise a C6 to C22 primary alkylamine such as hexadecylamine; a C6 to C22 secondary alkylamine such as dioctylamine; a C6 to C40 tertiary alkylamine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as diphenyl ether, or dibenzyl ether, or a combination thereof.

In the first mixture, amounts of the first precursor, the ligand compound, and the solvent may be appropriately selected as desired, and are not particularly limited.

If desired, the first mixture may be heated under vacuum or a nitrogen atmosphere at a predetermined temperature. The predetermined temperature may be a temperature of greater than or equal to about 40° C., for example, greater than or equal to about 50° C., greater than or equal to about 60° C., greater than or equal to about 70° C., greater than or equal to about 80° C., greater than or equal to about 90° C., greater than or equal to about 100° C., or greater than or equal to about 120° C. The predetermined temperature is lower than the reaction temperature for forming the shell layer which will be described later.

The (optionally heated) first mixture is mixed with the second precursor and the particle including the first semiconductor nanocrystal to provide the second mixture.

The second precursor may be appropriately selected according to a composition of the prepared shell layer. In an embodiment, the second precursor may include a Group V element or a compound including the same, Group VI element or a compound including the same, a halogen-containing compound, or a combination thereof. Examples of the second precursor include hexane thiol, octane thiol, decane thiol, dodecane thiol, hexadecane thiol, mercapto propyl silane, sulfur-trioctylphosphine ("S-TOP"), sulfur-tributylphosphine ("S-TBP"), sulfur-triphenylphosphine ("S-TPP"), sulfur-trioctylamine ("S-TOA"), trimethylsilyl sulfur, ammonium sulfide, sodium sulfide, selenium-trioctylphosphine ("Se-TOP"), selenium-tributylphosphine ("Se-TBP"), selenium-triphenylphosphine ("Se-TPP"), tellurium-tributylphosphine ("Te-TBP"), tellurium-triphenylphosphine ("Te-TPP"), tris trimethylsilyl phosphine, tris(dimethylamino) phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitrous oxide, nitric acid, ammonium nitrate, HF, $NH_4F$, HCl, $NH_4Cl$, HBr, $NH_4Br$, LiF, NaF, KF, $BeF_2$, $MgF_2$, $CaF_2$, $SrF_2$, CuF, AgF, AuF, $ZnF_2$, $CdF_2$, $HgF_2$, $AlF_3$, $GaF_3$, $InF_3$, $SnF_2$, $PbF_2$ LiCl, NaCl, KCl, $BeCl_2$, $MgCl_2$, $CaCl_2$, $SrCl_2$, CuCl, AgCl, AuCl, $ZnCl_2$, $CdCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, $HBF_4$, or an ionic liquid including a halogen element (e.g., fluorine), but are not limited thereto. The second precursor may be used alone or in a combination of two or more according to a composition of a prepared nanocrystal.

The particle including the first semiconductor nanocrystal may be a core. The particle including the first semiconductor nanocrystal may be a core-shell particle having a core and a shell layer disposed on the core and including a crystalline or amorphous material (e.g., a semiconductor nanocrystal). In this case, the quantum dot prepared by the foregoing process has a multi-layered shell even if the shell formation step is performed once.

The first semiconductor nanocrystal may include a Group II-VI compound, a Group III-V compound, a Group IV-VI compound, a Group IV element or compound, a Group I-III-VI compound, a Group I-II-IV-VI compound, or a combination thereof.

The Group II-VI compound may comprise a binary element compound comprising CdSe, CdTe, ZnS, ZnSe, ZnTe, ZnO, HgS, HgSe, HgTe, MgSe, MgS, or a combination thereof; a ternary element compound comprising CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHg Te, HgZnS, HgZnSe, HgZnTe, MgZnSe, MgZnS, or a combination thereof; and a quaternary element compound comprising HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof. The Group III-V compound may comprise a binary element compound comprising GaN, GaP, GaAs, GaSb, AlN, AlP, AlAs, AlSb, InN, InP, InAs, InSb, or a combination thereof; a ternary element compound comprising GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound comprising GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group IV-VI compound may comprise a binary element compound comprising SnS, SnSe, SnTe, PbS, PbSe, PbTe, or a combination thereof; a ternary element compound comprising SnSeS, SnSeTe, SnSTe, PbSeS, PbSeTe, PbSTe, SnPbS, SnPbSe, SnPbTe, or a combination thereof; and a quaternary element compound comprising SnPbSSe, SnPbSeTe, SnPbSTe, or a combination thereof. Examples of the Group I-III-VI compound include $CuInSe_2$, $CuInS_2$, CuInGaSe, and CuInGaS, but are not limited thereto. Examples of the Group I-II-IV-VI compound include CuZnSnSe and CuZnSnS, but are not limited thereto. The Group IV element or compound may include a single-element compound comprising Si, Ge, or a combination thereof; and a binary element compound comprising SiC, SiGe, or a combination thereof. The Group III-V compound may further include a Group II metal (e.g., InZnP etc.).

The second mixture is heated up to a reaction temperature to perform a reaction between the first precursor and the second precursor. Thereby, a layer of a shell including a crystalline or amorphous material is formed on the particle.

The reaction temperature is not particularly limited and may be appropriately selected considering the first precursor, the second precursor, a used solvent, and the like. For example, the reaction temperature may be greater than or equal to about 100° C., greater than or equal to about 150° C., greater than or equal to about 180° C., greater than or equal to about 200° C., or greater than or equal to about 220° C. The reaction temperature may be less than or equal to about 350° C., for example, less than or equal to about 320° C., less than or equal to about 300° C., or less than or equal to about 260° C.

The crystalline or amorphous material may include a Group II-VI compound, a Group III-V compound, a Group IV-VI compound, a Group IV compound, a metal-containing halogen compound, a metal oxide, or a combination thereof.

The process for preparing a quantum dot according to an embodiment may further include adding an organic solution including an ammonium fluorinated salt and optionally a metal salt to the second mixture during formation of the shell layer or after formation of the shell layer (See: FIG. 1). The ammonium fluorinated salt and the metal salt may modify a surface of a shell layer either as formed or during a formation process thereof.

A semiconductor nanocrystal based colloidal quantum dot has a large ratio of a surface area relative to a volume compared with a bulk material. Accordingly, the surface of the quantum dot may include many defects, which may cause non-light emitting bonds of excitons and thereby result in a decrease in luminous efficiency of the quantum dot. In addition, a contact between a surface of the quantum dot surface and external environments may cause surface oxidation, surface ligand loss, which may also lead to a decrease in electrical/optical properties of the quantum dot. A quantum dot having a core-shell structure including a core and an inorganic shell on a surface of the core has been suggested in order to solve such problems, but surface defects/oxidation drawbacks still remain.

In order to solve such drawbacks, a surface treatment of a core-type quantum dot with hydrofluoric acid ("HF") may be used. However, controlling an amount of the hydrofluoric acid is not easy and an excessive amount of the hydrofluoric acid may cause corrosion of the quantum dot. In addition, the hydrofluoric acid treatment may cause removal of surface ligands, changing dispersion characteristics of a quantum dot and/or deteriorate luminous efficiency. A technology of synthesizing a quantum dot by adding an ionic liquid ("IL") during formation of a core and/or a shell may be used instead of the hydrofluoric acid. The ionic liquid is a compound comprising an organic cation and an organic (or inorganic) anion, and unlike a solid salt, as the ions have a relatively large size and are not packed well, the ionic liquid has a low lattice energy, and thus has a low melting point of for example, around 100° C. or less. In contrast, the solid salt includes relatively small sized ions and thus is closely packed. Examples of the ionic liquid include 1-butyl-3-methylimidazolium tetrafluoroborate ("BMIM"), 1-hexyl-3-methylimidazolium hexafluoroborate ("hmim.PF6"), and the like. In the technology using the ionic liquid, an anion is present together at a core/shell formation temperature, is thermally decomposed, and thereby may provide fluoride with a surface of a quantum dot. However, the ionic liquid is difficult to dissolve in a solvent for a quantum dot synthesis and may cause phase-separation. Accordingly, a separation process of the remaining ionic liquid after the quantum dot synthesis may be required. The ionic liquid is a type of a relatively expensive special reagent. In addition, an amount of ionic liquid that may participate in the quantum dot modification reaction is limited and thus a relatively excessive amount of ionic liquid is required for a desirable modification.

In a process according to an embodiment, the added ammonium fluorinated salt may include a solid salt having a melting point of greater than or equal to about 110° C., for example, greater than or equal to about 120° C., about 130° C., greater than or equal to about 140° C., or greater than or equal to about 150° C. As used herein, the term "the solid salt" refers to a salt in a solid state.

The ammonium fluorinated salt has the aforementioned melting point and is a solid at a temperature of less than a melting point (e.g., room temperature). The present inventors have found that when such an ammonium fluorinated salt is used, a quantum dot may be modified without the foregoing drawbacks (e.g., with high efficiency at a relatively simplified process while not substantially changing the dispersibility characteristics of the quantum dot). For example, the present inventors have found that unlike the ionic liquid, the aforementioned solid salt may participate in the modification reaction of the quantum dot without forming a phase separation. In addition, the obtained quantum dot may show improved optical properties (e.g., increased luminous efficiency)/electrical properties (e.g., hole transporting rate) and may exhibit enhanced stability against external mediums and heat while Without being bound by any particular theory, as the ammonium fluorinated salt having a melting point of greater than or equal to about 150° C. may show a phase transition through an ammonium cation, using the same may reduce the number of the defects on a surface of a quantum dot and may increase stability of the quantum dot against an external environment.

The ammonium fluorinated salt added during and/or after formation of a shell may easily transport an anion component to the quantum dot at the interface between the quantum dot and the reaction solution under a relatively mild condition (e.g., a condition not causing a substantial removal of a ligand compound therefrom), and the anion component may dope on the surface of the prepared quantum dot or may form a bond with a component (e.g., a metal component) on the surface of the quantum dot to provide passivation for the surface of the quantum dot.

The ammonium fluorinated salt may be dissolved in an organic solvent miscible with the solvent used for the quantum dot synthesis to form an organic solution and thus does not cause a phase-separation during synthesis of the quantum dot, and accordingly, recovery of the quantum dot does not entail a separation process. In addition, unlike the conventional process using the ionic liquid, according to the embodiments, the passivation of the quantum dot may occur under a relatively mild reaction condition and a smaller amount of the ammonium fluorinated salt may be used to form passivation at substantially the same level than the amount of the ionic liquid used in the conventional process. Furthermore, the ammonium fluorinated salt is less expensive than the ionic liquid and may provide an additional advantage in terms of the process.

For example, the ammonium fluorinated salt may be dissolved in solvent that comprises a C3 to C12 ketone, a C1 to C24 amine, a C1 to C12 alcohol, a C4 to C9 nitrogen-containing heterocyclic compound, a C1 to C40 (or C6 to C18) substituted or unsubstituted aliphatic hydrocarbon, a C6 to C40 (or C6 to C14) substituted or unsubstituted aromatic hydrocarbon, a C2 to C8 nitrile, C2 to C20 amide, or a combination thereof, and accordingly the organic solution may include these solvents. Examples of the C3 to C12 ketone include acetone, methylethylketone, diethyl ketone, methylisobutylketone, or cyclohexanone; examples of the C1 to C24 amine include a C6 to C22 primary alkylamine such as hexadecylamine or oleyl amine, a C6 to C22 secondary alkylamine such as dioctylamine, or a C6 to C40 tertiary alkylamine such as trioctylamine; examples of the C1 to C12 alcohol include ethanol, isopropanol, butanol, phenol, or benzyl alcohol; examples of the C4 to C9 nitrogen-containing heterocyclic compound include furan, tetrahydrofuran, pyrrolidone, or pyridine; examples of the C1 to C40 substituted or unsubstituted aliphatic hydrocarbon include methylene chloride, hexadecane, octadecane, octadecene, or squalane; examples of the C6 to C14 substituted or unsubstituted aromatic hydrocarbon include tolunene (toluene) phenyldodecane, phenyltetradecane, or phenyl hexadecane; examples of C2 to C20 amide include dimethylformamide, and examples of the C2 to C8 nitrile include acetonitrile.

The ammonium fluorinated salt may include a compound represented by Chemical Formula 1:

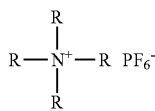

Chemical Formula 1 wherein, each R is the same or different and is independently a C1 to C16 aliphatic hydrocarbon group, for example, an alkyl group, an alkenyl group, an alkynyl group, or a C6 to C20 (e.g., C6 or C7) aromatic hydrocarbon group, for example aryl group, provided that at least two of R's are linked with each other to form a ring.

The ammonium fluorinated salt may include a symmetric tetraalkyl ammonium salt wherein all R groups are the same), an asymmetric tetraalkylammonium salt (wherein at least one R group differs from one or more other R groups), aryltrialkyl ammonium salt, or a combination thereof. The alkyl groups can be C1 to C16 alkyl groups, which may be unsubstituted or substituted as described herein. In an embodiment, the substituent is a phenyl group. The ammonium fluorinated salt may include tetramethylammonium hexafluorophosphate, tetraethylammonium hexafluorophosphate, tetrapropylammonium hexafluorophosphate, tetrabutylammonium hexafluorophosphate, tetrahexylammonium hexafluorophosphate, ethyltrimethylammonium hexafluorophosphate, benzyltrimethylammonium hexafluorophosphate, dodecyltrimethylammonium hexafluorophosphate, hexadecyltrimethylammonium hexafluorophosphate, or a combination thereof.

A content of the ammonium fluorinated salt may be greater than or equal to about 0.0001 mole, for example, greater than or equal to about 0.001 mole, greater than or equal to about 0.01 mole, greater than or equal to about 0.05 mole, greater than or equal to about 0.1 mole, or greater than or equal to about 0.2 mole per a mole of the first precursor. The amount of the ammonium fluorinated salt may be less than or equal to about 100 mole, for example, less than or equal to about 50 mole, less than or equal to about 40 mole, less than or equal to about 30 mole, less than or equal to about 20 mole, less than or equal to about 10 mole, less than or equal to about 9 mol, less than or equal to about 8 mole, less than or equal to about 7 mole, less than or equal to about 6 mole, less than or equal to about 5 mole, less than or equal to about 4 mole, less than or equal to about 3 mole, less than or equal to about 2 mole, or less than or equal to about 1 mole per a mole of the first precursor.

The metal salt may include a compound represented by Chemical Formula 2:

$$M^+X^- \qquad \text{Chemical Formula 2}$$

wherein, M is zirconium, hafnium, aluminum, or a combination thereof, X is a C1 to C10 alkoxide (e.g., isopropoxide, butoxide, methoxide, ethoxide, etc.), $RCOCH_2COR^-$ (wherein, each R is the same or different and is independently a C1 to C10 aliphatic hydrocarbon group or a C6 to C20 aromatic hydrocarbon group), or a C1 to C18 carboxylate.

Examples of the metal salt include zirconium acetylacetonate, hafnium acetylacetonate, aluminum acetylacetonate, zirconium alkoxide (e.g., isopropoxide, butoxide, methoxide, ethoxide, etc.), hafnium alkoxide (e.g., isopropoxide, butoxide, methoxide, ethoxide, etc.), aluminum alkoxide (e.g., isopropoxide, butoxide, methoxide, ethoxide, etc.), or a combination thereof. In an embodiment, the metal salt does not include a halide.

A metal cation of the metal salt may additionally passivate the surface of the quantum dot with an anion of the ammonium fluorinated salt and may improve electrical/optical properties and surface stability of the quantum dot. A content of the metal salt may be greater than or equal to about 0.0001 mole, for example, greater than or equal to about 0.001 mole, greater than or equal to about 0.01 mole, greater than or equal to about 0.05 mole, greater than or equal to about 0.1 mole, or greater than or equal to about 0.2 mole per a mole of the first precursor. A content of the metal salt may be less than or equal to about 100 mole, for example, less than or equal to about 50 mole, less than or equal to about 40 mole, less than or equal to about 30 mole, less than or equal to about 20 mole, less than or equal to about 10 mole, less than or equal to about 9 mole, less than or equal to about 8 mol, less than or equal to about 7 mol, less than or equal to about 6 mol, less than or equal to about 5 mol, less than or equal to about 4 mol, less than or equal to about 3 mol, less than or equal to about 2 mol, or less than or equal to about 1 mol per a mole of the first precursor.

In the process of an embodiment, the forming of the layer of the shell may be performed at least twice to form a multi-layered shell including at least two layers. In this case, the first precursor, the second precursor, the ammonium fluorinated salt, the metal salt, or the combination thereof may be changed during formation of each layer so that two adjacent layers may have different compositions. For example, different types and/or different amounts of the precursors, different types and/or different amounts of the ammonium fluoride salt, and/or different types and/or different amounts of the metal salt may be used to form each layer, considering desirable compositions of each layer during formation of each layer. During the process, the aforementioned organic solution may be added during formation of any layer of multi-layered shell. In an embodiment, the organic solution may be added to a second mixture during formation of the outermost layer of the multi-layered shell, and in this case, the outermost shell may be passivated by the anion of the above ammonium fluorinated salt and optionally, the cation of the metal salt.

When an excessive amount of a non-solvent is added to a reaction solution including the quantum dot, a precipitate may be formed therein and separated (e.g., centrifuged). As described above, the ammonium fluorinated salt may not form a separated phase in the process of the embodiment, and thus the recovery process may not entail an additional process for separating the ammonium fluorinated salt. Specific examples of the non-solvent include acetone, ethanol, methanol, and the like but are not limited thereto.

An embodiment provides a quantum dot prepared by the process according an embodiment. The quantum dot includes a core including a first semiconductor nanocrystal and a shell disposed on the core and including a crystalline or amorphous material and the shell includes phosphorus, fluorine, and optionally a transition metal. The transition metal may include zirconium, hafnium, aluminum, or a combination thereof. In the shell, the phosphorus and the transition metal may be present as being doped and the fluorine may be present as being doped or in the form of a fluoride.

By the addition of the ammonium fluorinated salt or the ammonium fluorinated salt and the metal salt to the reaction solution during or after formation of the shell, the anion supplied from the ammonium fluorinated salt is in the shell and optionally, the metal cation may passivate the quantum dot. In an embodiment, the phosphorus and the transition metal may be present as being doped (e.g., in a doped form), and the fluorine may be present as being doped or as a fluoride. The phosphorous and the fluorine present in a quantum dot shell (or on a surface of the shell) may be confirmed by an electron microscope analysis or energy dispersive X ray spectroscopy ("EDX") of the quantum dot.

The first semiconductor nanocrystal may include a Group II-VI compound, a Group III-V compound, a Group IV-VI compound, a Group IV element or compound, a Group I-III-VI compound, a Group I-II-IV-VI compound, or a combination thereof.

The crystalline or amorphous material may include a Group II-VI compound, a Group III-V compound, a Group IV-VI compound, a Group IV compound, a metal-containing halogen compound, a metal oxide, or a combination thereof.

Examples of the Group II-VI compound, the Group III-V compound, the Group IV-VI compound, the Group IV element or compound, the Group I-III-VI compound, the Group I-II-IV-VI compound, the metal-containing halogen compound, and the metal oxide are the same as described above. For example, the Group II-VI compound, the Group III-V compound, the Group IV-VI compound, the Group IV element or compound, the Group I-III-VI compound, the Group I-II-IV-VI compound may include a binary element compound, a ternary element compound, or a quaternary element compound. The binary element compound, the ternary element compound, or the quaternary element compound may be present inside a particle at a uniform concentration or may be present inside the same particle at a partially different concentration distribution. In a quantum dot according to an embodiment, a material composition constituting the shell may have greater energy bandgap than that of the core. In a quantum dot according to an embodiment, a material composition constituting the core may have greater energy bandgap than that of the shell. In a multi-layered shell, an outer shell of a core may have a greater energy bandgap than a shell near to a core In a quantum dot having a multi-layered shell, a material constituting a shell of each layer may have greater or smaller energy bandgap than a core.

The quantum dot may have a particle size (e.g., diameter) of about 1 nanometer (nm) to about 100 nm. In an embodiment, the quantum dot may have a diameter of about 1 nm to about 20 nm, for example, about 2 nm (or about 3 nm) to about 15 nm. In an embodiment, the quantum dot may have a size of less than or equal to about 10 nm, for example, less than or equal to about 9 nm, less than or equal to about 8 nm, or less than or equal to about 7 nm.

A shape of the quantum dot is not particularly limited. For example, the quantum dot may have a spherical shape, a pyramidal shape, a multi-armed shape, a polygonal shape, a cubic shape, a nanotube, a nanowire, a nanorod, a nanofiber, a nanosheet, or a combination thereof, but is not limited thereto.

The quantum dot may include a ligand compound on the surface. Details of the ligand compound are the same as described above.

A quantum dot according to an embodiment may have a quantum efficiency of greater than or equal to about 10%, for example, greater than or equal to about 30%, greater than or equal to about 50%, greater than or equal to about 60%, greater than or equal to about 70%, greater than or equal to about 90% or even about 100%. A quantum dot according to an embodiment may have a full width at half maximum ("FWHM") of less than or equal to about 45 nm, for example less than or equal to about 40 nm, or less than or equal to about 30 nm in a light emitting wavelength spectrum. The quantum dot may emit light in wavelength ranges of ultraviolet ("UV") to visible ray or near infrared ray or more by changing sizes and compositions. For example, the quantum dot may emit light in a wavelength of about 300 nm to about 700 nm or about 700 nm or greater, but is not limited thereto.

The quantum dot may include phosphorus (P) of greater than or equal to about 1.2 mol, for example, greater than or equal to about 1.3 mol, greater than or equal to about 1.4 mol, greater than or equal to about 1.5 mol, greater than or equal to about 1.6 mol, greater than or equal to about 1.7 mol, or greater than or equal to about 1.8 mol based on 1 mol of a metal (e.g., a Group 3 metal such as indium) included in a core according to an ICP-AES analysis. When the quantum dot includes the above transition metal, the transition metal may be included in an amount of greater than or equal to about 0.001 mole, for example, greater than or equal to about 0.005 mole, greater than or equal to about 0.006 mole, greater than or equal to about 0.01 mole, greater than or equal to about 0.05 mole, greater than or equal to about 0.06 mole, greater than or equal to about 0.07 mole, greater than or equal to about 0.08 mole, greater than or equal to about 0.09 mole, or greater than or equal to about 0.10 mole based on a mole of a metal (e.g., a Group 3 metal such as indium) included in a core in the ICP-AES analysis of the quantum dot.

A quantum dot according to an embodiment may be dispersed in a, polymer matrix to provide a quantum dot-polymer composite. The quantum dot polymer composite may be used as a light conversion layer (or color conversion film) or (patterned as described later) photoluminescent color filter. A polymer included in the polymer matrix is not particularly limited and may be any polymer for the quantum dot-polymer composite.

In an embodiment, the polymer matrix may include a cross-linked polymer and a linear polymer having a carboxylic acid-containing repeating unit (carboxylic acid polymer).

In the carboxylic acid polymer, the carboxylic acid-containing repeating unit may be derived from a monomer including a carboxylic acid group and a carbon-carbon double bond, a monomer having a dianhydride moiety, or a combination thereof.

The cross-linked polymer may be a polymer cross-linked by light.

The cross-linked polymer may include a thiol-ene resin, a cross-linked poly(meth)acrylate, a cross-linked polyurethane, a cross-linked epoxy resin, a cross-linked vinyl polymer, a cross-linked silicone resin, or a combination thereof. The cross-linked polymer may be a copolymer. The cross-linked polymer may be a polymerization product of a photopolymerizable compound (e.g., a monomer or an oligomer) having one or more, for example, two, three, four, five, six, or more photopolymerizable functional groups (e.g., carbon-carbon double bonds such as (meth)acrylate groups, allyl groups, vinyl groups, epoxy groups, etc.). The photopolymerizable compound may be a generally-used photopolymerizable monomer or oligomer in a photosensitive resin composition.

In an embodiment, the photopolymerizable compound may include an ethylenic unsaturated monomer such as a (meth)acrylate monomer or a vinyl monomer; a reactive oligomer having two or more photopolymerizable moieties (e.g., epoxy groups, vinyl groups, etc.) (e.g., ethylene oligomer, alkylene oxide oligomer, etc.); a copolymer of the reactive oligomer and the ethylenic unsaturated monomer, a urethane oligomer having two or more photopolymerizable moieties (e.g., (meth)acrylate moieties), a siloxane oligomer having two or more photopolymerizable moieties, or a combination thereof. The photopolymerizable compound may further include a thiol compound having at least two thiol groups at both terminal ends. The photopolymerizable compound may be commercially available or may be synthesized by a known method. The cross-linked polymer may be a polymerization product of a mixture including the photopolymerizable compound.

The (meth)acrylate monomer may include a monofunctional or multi-functional ester of (meth)acrylic acid having at least one carbon-carbon double bond. The (meth)acrylate monomer may include a di(meth)acrylate compound, a tri(meth)acrylate compound, a tetra(meth)acrylate compound, a penta(meth)acrylate compound, a hexa(meth)acrylate compound, or a combination thereof. Examples of the (meth)acrylate monomer include a (C1 to C30 alkyl) (meth) acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentylglycol di(meth)acrylate, pentaerythritol di(meth)acrylate, pentaerythritol tri(meth)acrylate, pentaerythritol tetra(meth)acrylate, dipentaerythritol di(meth) acrylate, dipentaerythritol tri(meth)acrylate, dipentaerythritol penta(meth)acrylate, dipentaerythritol hexa(meth) acrylate, bisphenol A epoxy acrylate, bisphenol A di(meth) acrylate, trimethylolpropane tri(meth)acrylate, novolac epoxy (meth)acrylate, ethylglycolmonomethylether (meth) acrylate, tris(meth)acryloyloxyethyl phosphate, diethylene glycol di(meth)acrylate, triethylene glycol di(meth)acrylate, or propylene glycol di(meth)acrylate, but are not limited thereto.

The thiol compound having at least two thiol groups at both terminal ends may be a compound represented by Chemical Formula 3:

Chemical Formula 3

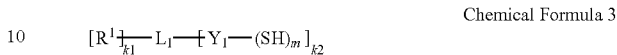

wherein, in the chemical formula, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $-NH_2$; a substituted or unsubstituted C1 to C30 amine group ($-NRR'$, wherein R and R' are the same or different, and are independently hydrogen or a C1 to C30 linear or branched alkyl group, provided that R and R' are not hydrogen simultaneously); an isocyanate group; a halogen; $-ROR'$ (wherein R is a substituted or unsubstituted C1 to C20 alkylene group and R' is hydrogen or a C1 to C20 linear or branched alkyl group); an acyl halide ($-RC(=O)X$, wherein R is a substituted or unsubstituted alkylene group and X is a halogen); $-O(=O)OR'$ (wherein R' is hydrogen or a C1 to C20 linear or branched alkyl group); $-CN$; $-C(=O) NRR'$ or $-C(=O)ONRR'$ (wherein R and R' are the same or different, and are independently hydrogen or a C1 to C20 linear or branched alkyl group); or a combination thereof, $L_1$ is a carbon atom, a substituted or unsubstituted C1 to C30 alkylene moiety, a substituted or unsubstituted C3 to C30 cycloalkylene moiety, a substituted or unsubstituted C6 to C30 arylene moiety, or a substituted or unsubstituted C3 to C30 heteroarylene moiety wherein at least one methylene ($-CH_2-$) of the substituted or unsubstituted C1 to C30 alkylene group may be replaced by sulfonyl ($-SO_2-$), carbonyl (C=O), ether ($-O-$), sulfide ($-S-$), sulfoxide ($-S=O-$), ester ($-O(=O)O-$), amide ($-C(=O) NR-$) (wherein R is hydrogen or a C1 to C10 alkyl group) or a combination thereof, $Y_1$ is a single bond; a substituted or unsubstituted C1 to C30 alkylene group; a substituted or unsubstituted C2 to C30 alkenylene group; or a C2 to C30 alkylene group or a C3 to C30 alkenylene group wherein at least one methylene ($-CH_2-$) is replaced by a sulfonyl ($-S(=O)_2-$), a carbonyl ($-O(=O)-$), an ether ($-O-$), a sulfide ($-S-$), a sulfoxide ($-S(=O)-$), an ester ($-O(=O) O-$), an amide ($-O(=O)NR-$) (wherein R is hydrogen or a C1 to C10 linear or branched alkyl group), an imine ($-NR-$) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that when $Y_1$ is not a single bond, m does not exceed the valence of $Y_1$ and provided that the sum of k1 and k2 does not exceed the valence of $L_1$.

The thiol compound may include a compound represented by Chemical Formula 3-1:

Chemical Formula 3-1

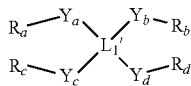

wherein, in the chemical formula, $L_1'$ is carbon, a substituted or unsubstituted C2 to C20 alkylene moiety, a substituted or unsubstituted C6 to C30 arylene moiety; a substituted or unsubstituted C3 to C30 heteroarylene moiety; a substituted or unsubstituted C3 to C30 cycloalkylene moiety; or a substituted or unsubstituted C3 to C30 heterocycloalkylene moiety, each of $Y_a$ to $Y_d$ is the same or different, and is independently a single bond; a substituted or unsubstituted C1 to C30 alkylene group; a substituted or unsubstituted C2 to C30 alkenylene group; or a C2 to C30 alkylene group or a C3 to C30 alkenylene group wherein at least one methylene (—CH$_2$—) is replaced by an sulfonyl (—S(=O)$_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 linear or branched alkyl group), an imine (—NR—) (wherein R is hydrogen or a C1 to C10 linear or branched alkyl group), or a combination thereof, and each of $R_a$ to $R_d$ is the same or different and is independently $R^1$ of Chemical Formula 1 or SH, provided that at least two of $R_a$ to $R_d$ are SH.

The thiol compound may be a dithiol compound, a trithiol compound, a tetrathiol compound, or a combination thereof. For example, the reactive compound may be glycol di-3-mercaptopropionate, glycol dimercapto acetate, trimethylol propane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof. A reaction between the thiol compound and the ethylenic unsaturated monomer may provide a thiol-ene resin.

The linear polymer having a carboxylic acid-containing repeating unit (hereinafter, also referred to as a carboxylic acid polymer) may be a copolymer of monomer mixture of a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure where two aromatic rings are bound to a quaternary carbon atom that is a constituent atom of another cyclic moiety in the main chain and including a carboxylic acid group (—COOH); or a combination thereof.

The carboxylic acid-containing repeating unit may be derived form a monomer including a carboxylic acid group and a carbon-carbon double bond, a monomer having a dianhydride moiety, or a combination thereof.

Examples of the first monomer include carbonic acid vinyl ester compounds such as acrylic acid, methacrylic acid, maleic acid, itaconic acid, fumaric acid, 3-butenoic acid, vinyl acetate, or vinyl benzoate, but are not limited thereto. The first monomer may be at least one compound. Examples of the second monomer include an alkenyl aromatic compound such as styrene, α-methyl styrene, vinyl toluene, or vinyl benzyl methyl ether; an unsaturated carbonic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate; unsaturated carbonic acid amino alkyl ester compound such as 2-amino ethyl acrylate, 2-amino ethyl methacrylate, 2-dimethyl amino ethyl acrylate, N-phenylmaleimide, N-benzylmaleimide, N-alkylmaleimide, or 2-dimethyl amino ethyl methacrylate; an unsaturated carbonic acid glycidyl ester compound such as glycidyl acrylate or glycidyl methacrylate; a vinyl cyanide compound such as acrylonitrile, methacrylonitrile; or an unsaturated amide compound such as acryl amide or methacryl amide, but are not limited thereto. As the second monomer, at least one compound may be used. Examples of the third monomer include 2-hydroxyethyl acrylate, 2-hydroxyethyl methacrylate, 2-hydroxybutyl acrylate, or 2-hydroxybutyl methacrylate, but are not limited thereto. As the third monomer, at least one compound may be used.

The copolymer may include a first repeating unit derived from the first monomer, a second repeating unit derived from the second monomer, and optionally a third repeating unit derived from the third monomer. In the copolymer, a content of the first repeating unit may be greater than or equal to about 10 mol %, for example, greater than or equal to about 15 mol %, greater than or equal to about 25 mol %, or greater than or equal to about 35 mol %. In the carboxylic acid polymer, a content of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, a content of the second repeating unit may be greater than or equal to about 10 mol %, for example, greater than or equal to about 15 mol %, greater than or equal to about 25 mol %, or greater than or equal to about 35 mol %. In the binder polymer, a content of the second repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the copolymer, if it is present, a content of the third repeating unit may be greater than or equal to about 1 mol %, for example, greater than or equal to about 5 mol %, greater than or equal to about 10 mol %, or greater than or equal to about 15 mol %. In the binder polymer, a content of the third repeating unit may be less than or equal to about 20 mol %, for example, less than or equal to about 15 mol %, or less than or equal to about 10 mol %.

The copolymer may be a copolymer of (meth)acrylic acid and; at least one second/third monomer comprising a (C7 to C30 arylalkyl) (meth)acrylate, a (C1 to C30 hydroxyalkyl) (meth)acrylate, and styrene. For example, the binder polymer may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxyethyl methacrylate copolymer, or a methacrylic acid/benzyl methacrylate/styrene/2-hydroxyethyl methacrylate copolymer.

The carboxylic acid polymer may include a multiple aromatic ring-containing polymer. The multiple aromatic ring-containing polymer has a backbone structure where two aromatic rings are bound to a quaternary carbon atom that is a constituent atom of another cyclic moiety in the main chain (e.g., being bound to the main chain) and includes a carboxylic acid group (—COOH).

In the multiple aromatic ring-containing polymer, the backbone structure may be represented by Chemical Formula A:

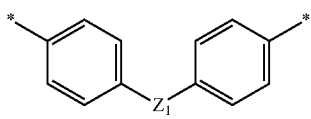

Chemical Formula A wherein, * is a portion that is linked to an adjacent atom of the main chain of the binder, and $Z_1$ is a linking moiety represented by any one of Chemical Formulae A-1 to A-6, and in Chemical Formulae A-1 to A-6, * is a portion that is linked to an aromatic moiety:

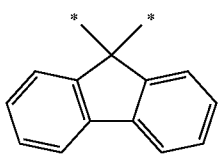

Chemical Formula A-1

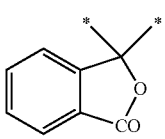

Chemical Formula A-2

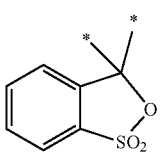

Chemical Formula A-3

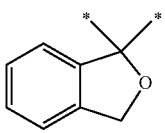

Chemical Formula A-4

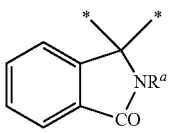

Chemical Formula A-5 wherein, $R^a$ is a hydrogen, an ethyl group, $C_2H_4Cl$, $C_2H_4OH$, $CH_2CH=CH_2$, or a phenyl group,

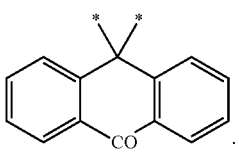

Chemical Formula A-6

The multiple aromatic ring-containing polymer may include a repeating unit represented by Chemical Formula B:

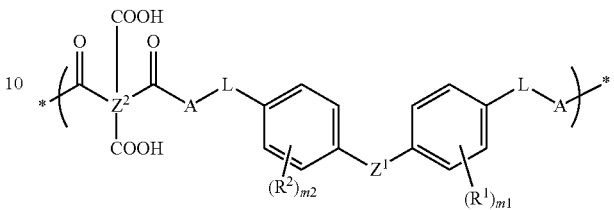

Chemical Formula B wherein $Z^1$ is a linking moiety represented by any one of Chemical Formulae A-1 to A-6, L is a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, A is —NH—, —O—, or a C1 to C10 alkylene, each of $R^1$ and $R^2$ is the same or different, and is independently hydrogen, a halogen, or a substituted or unsubstituted C1 to C20 alkyl group, m1 and m2 are the same or different, and are independently an integer ranging from 0 to 4, and $Z^2$ is a C6 to C40 aromatic organic group.

In Chemical Formula B, $Z^2$ may be any one of Chemical Formula B-1, Chemical Formula B-2, and Chemical Formula B-3:

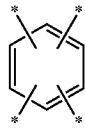

Chemical Formula B-1 wherein * is a portion that is linked to an adjacent carbonyl carbon,

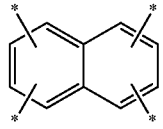

Chemical Formula B-2 wherein * is a portion that is linked to an adjacent carbonyl carbon,

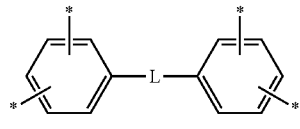

Chemical Formula B-3 wherein * is a portion that is linked to an adjacent carbonyl carbon, L is a single bond, —O—, —S—, —C(=O)—, —CH(OH)—, —S(=O)$_2$—, —Si(CH$_3$)$_2$—, $(CH_2)_p$ (wherein $1 \leq p \leq 10$), $(CF_2)_q$ (wherein $1 \leq q \leq 10$), $-CR_2-$ (wherein each R is the same or different, and is independently hydrogen, a C1 to C10 aliphatic hydrocarbon group, a C6 to C20 aromatic hydrocarbon group, or a C6 to C20 alicyclic hydrocarbon group), $-C(CF_3)_2-$, $-C(CF_3)(C_6H_5)-$, or $-C(=O)NH-$.

The multiple aromatic ring-containing polymer may include a structural unit represented by Chemical Formula C:

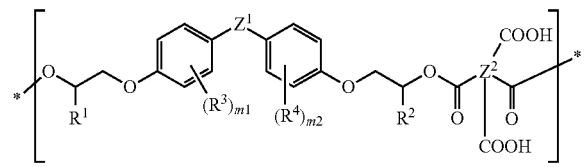

Chemical Formula C wherein each of $R^1$ and $R^2$ is the same or different, and is independently hydrogen or a substituted or unsubstituted (meth)acryloyloxyalkyl group, each of $R^3$ and $R^4$ is the same or different, and is independently hydrogen, a halogen, or a substituted or unsubstituted C1 to C20 alkyl group, $Z^1$ is a moiety comprising a linking moiety represented by Chemical Formulae A-1 to A-6, $Z^2$ is an aromatic organic group such as the moieties set forth above, and m1 and m2 are the same or different, and are independently an integer ranging from 0 to 4.

In an embodiment, the multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The reaction scheme may be summarized as below:

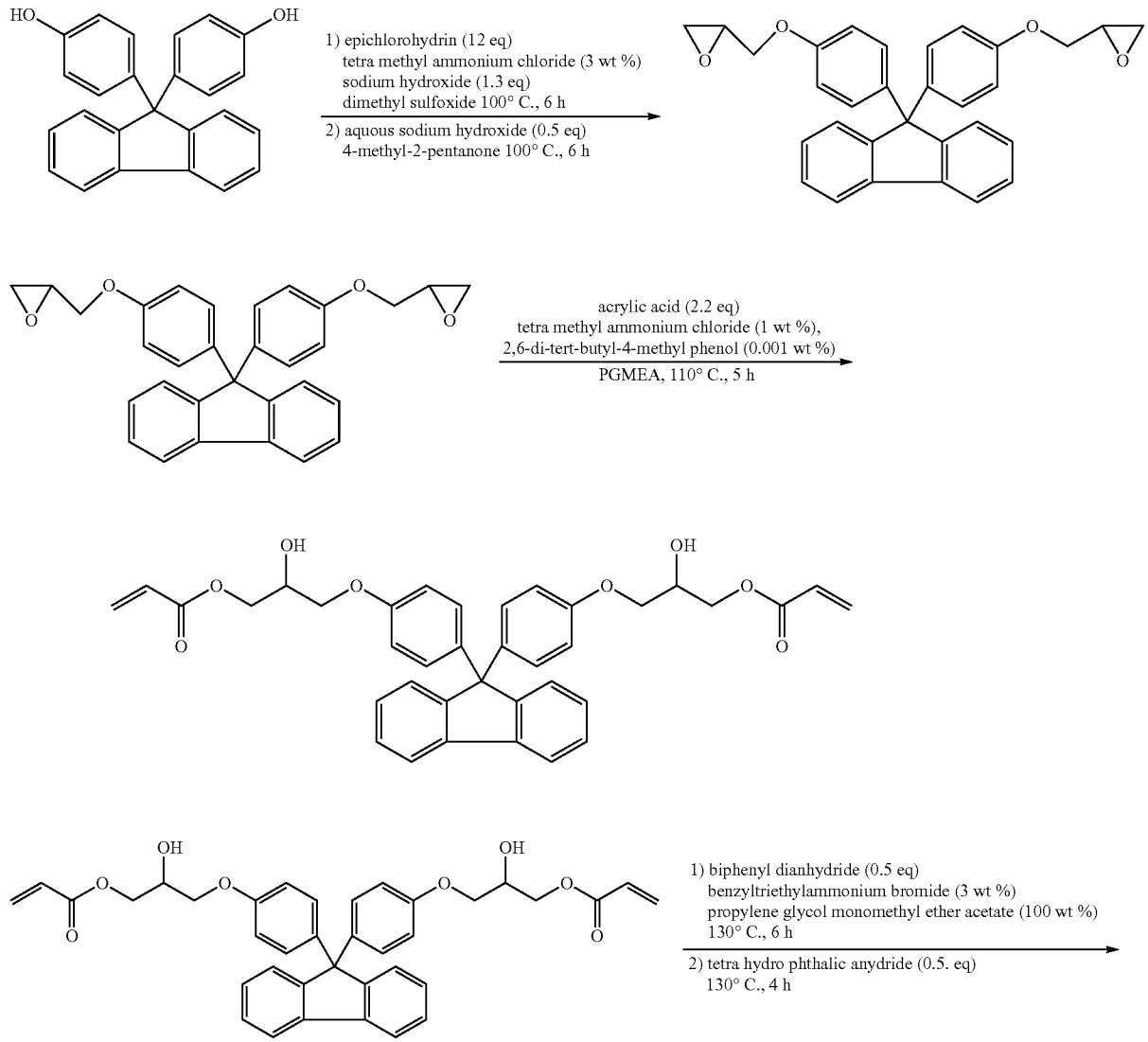

-continued

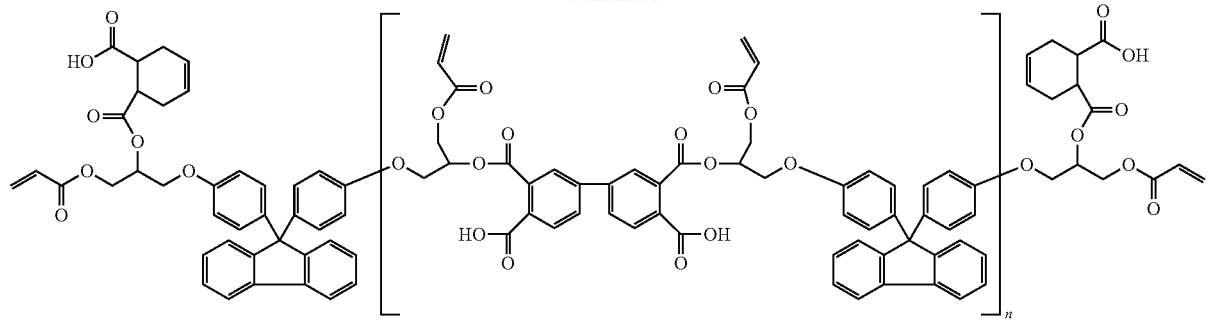

The multiple aromatic ring-containing polymer may include a functional group represented by Chemical Formula D at one or both terminal ends:

Chemical Formula D

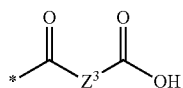

wherein, in Chemical Formula D, $Z^3$ is a moiety represented by one of Chemical Formulae D-1 to D-7:

Chemical Formula D-1

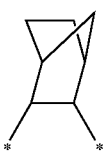

wherein, $R^b$ and $R^c$ are the same or different, and are independently hydrogen, a substituted or unsubstituted C1 to C20 alkyl group, an ester group, or an ether group.

Chemical Formula D-2

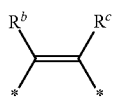

Chemical Formula D-3

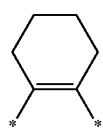

Chemical Formula D-4

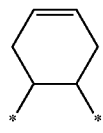

Chemical Formula D-5

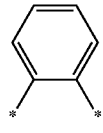

wherein, $R^d$ is O, S, NH, a substituted or unsubstituted C1 to C20 alkylene group, a C1 to C20 alkylamine group, or a C2 to C20 alkenylamine group.

Chemical Formula D-6

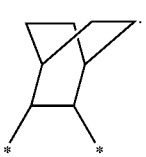

Chemical Formula D-7

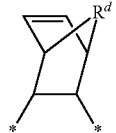

The multiple aromatic ring-containing polymer may be synthesized by a known method or is commercially available (e.g., from Nippon Steel Chemical Co., Ltd.).

The multiple aromatic ring-containing polymer may include a reaction product of a fluorene compound comprising 9,9-bis(4-hydroxyphenyl)fluorene, 9,9-bis(4-aminophenyl)fluorene, 9,9-bis[4-(glycidyloxy)phenyl]fluorene, and 9,9-bis[4-(2-hydroxyethoxy)phenyl]fluorene with an appropriate compound capable of reacting with the fluorene compound (e.g., an aromatic dianhydride comprising 9,9-bis-(3,4-dicarboxyphenyl)fluorene dianhydride, pyromellitic dianhydride ("PMDA"), biphenyltetracarboxylic dianhydride ("BPDA"), benzophenonetetracarboxylic dianhydride, and naphthalenetetracarboxylic dianhydride, a C2 to C30 diol compound, epichlorohydrin, or the like). The fluorene compound, dianhydrides, a diol compound, and the like are commercially available, and the reaction conditions therebetween are known in the art.

An acid value of the carboxylic acid polymer may be greater than or equal to about 50 milligrams (mg) KOH/gram (g). For example, the carboxylic acid polymer may be greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, or greater than or equal to about 120 mg KOH/g. The acid value of the polymer may be for example less than or equal to about 250 mg KOH/g, for example, less than or equal to about 200 mg KOH/g, less than or equal to about 190 mg KOH/g, less than or equal to about 180 mg KOH/g, or less than or equal to about 160 mg KOH/g.

The quantum dot polymer composite may be for example patterned by a process including the following steps:

coating a composition including the quantum dot according to an embodiment, a photopolymerizable compound including at least two polymerizable moieties, a carboxylic acid linear polymer (e.g., a binder), a photoinitiator, and an organic solvent on a transparent substrate to form a film;

exposing a predetermined region of the formed film to light in a wavelength of less than 550 nm (e.g., less than or equal to about 450 nm, less than or equal to about 420 nm, or less than or equal to about 410 nm) to perform a cross-linking polymerization in an exposed region and to form a quantum dot polymer composite dispersed in a polymer matrix; and removing an unexposed region from the film using an alkali aqueous solution to obtain a quantum dot-polymer composite pattern.

Types of the photoinitiator of the composition are not particularly limited, and may be selected appropriately. For example, the available photoinitiator may include a triazine-based compound, an acetophenone-based compound, a benzophenone-based compound, a thioxanthone-based compound, a benzoin-based compound, an oxime-based compound, or a combination thereof, but it is not limited thereto.

Examples of the triazine-based compound include 2,4,6-trichloro-s-triazine, 2-phenyl-4,6-bis(trichloromethyl)-s-triazine, 2-(3',4'-dimethoxy styryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2,4-trichloromethyl (piperonyl)-6-triazine, or 2,4-trichloromethyl (4'-methoxystyryl)-6-triazine but it is not limited thereto.

Examples of the acetophenone-based compound include 2,2'-diethoxy acetophenone, 2,2'-dibutoxy acetophenone, 2-hydroxy-2-methyl propinophenone, p-t-butyl trichloro acetophenone, p-t-butyl dichloroacetophenone, 4-chloroacetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholinophenyl)-butan-1-one, but are not limited thereto.

Examples of the benzophenone-based compound include benzophenone, benzoyl benzoate, benzoyl methyl benzoate, 4-phenyl benzophenone, hydroxy benzophenone, (meth)acrylated benzophenone, 4,4'-bis(di methyl amino)benzophenone, 4,4'-dichloro benzophenone, 3,3'-dimethyl-2-methoxy benzophenone, but are not limited thereto.

Examples of the thioxanthone-based compound include thioxanthone, 2-methyl thioxanthone, 2-isopropyl thioxanthone, 2,4-diethyl thioxanthone, 2,4-diisopropyl thioxanthone, 2-chloro thioxanthone, and the like, but are not limited thereto.

Examples of the benzoin-based compound include benzoin, benzoin methyl ether, benzoin ethyl ether, benzoin isopropyl ether, benzoin isobutyl ether, or benzyl dimethyl ketal, but are not limited thereto.

Examples of the oxime-based compound include 2-(o-benzoyloxime)-1-[4-(phenylthio)phenyl]-1,2-octandione and 1-(o-acetyloxime)-1-[9-ethyl-6-(2-methylbenzoyl)-9H-carbazol-3-yl]ethanone, but are not limited thereto. The photoinitiator may also be a carbazole-based compound, a diketone compound, a sulfonium borate-based compound, a diazo-based compound, a biimidazole-based compound, and the like, in addition to the photoinitiator.

The composition may include a solvent. The solvent may be appropriately selected considering affinity for other components in the composition (e.g., a carboxylic acid polymer, a photopolymerizable compound, a photoinitiator, other additives, and the like), affinity for an alkali developing solution, a boiling point, and the like. The composition may include the solvent in a balance amount except for the amounts of desired solids (non-volatile powder).

Non-limiting examples of the solvent include ethylene glycols such as ethyl 3-ethoxy propionate; ethylene glycol, diethylene glycol, or polyethylene glycol; glycolethers such as ethylene glycolmonomethylether, ethylene glycolmonoethylether, diethylene glycolmonomethylether, ethylene glycoldiethylether, or diethylene glycoldimethylether; glycoletheracetates such as ethylene glycolacetate, ethylene glycolmonoethyletheracetate, diethylene glycolmonoethyletheracetate, or diethylene glycolmonobutyletheracetate; propylene glycols such as propylene glycol; propylene glycolethers such as propylene glycolmonomethylether, propylene glycolmonoethylether, propylene glycolmonopropylether, propylene glycolmonobutylether, propylene glycoldimethylether, dipropylene glycoldimethylether, propylene glycoldiethylether, or dipropylene glycoldiethylether; propylene glycoletheracetates such as propylene glycolmonomethyl ether acetate, or dipropylene glycolmonoethyletheracetate; amides such as N-methylpyrrolidone, dimethyl formamide, dimethyl acetamide; ketones such as methylethylketone ("MEK"), methylisobutylketone ("MIBK"), or cyclohexanone; petroleums such as toluene, xylene, or solvent naphtha; esters such as ethyl acetate, butyl acetate, or ethyl lactate; ethers such as diethyl ether, dipropyl ether, or dibutyl ether and, and a mixture thereof.

If desired, the photosensitive composition may further include various additives such as a light diffusing agent, a leveling agent, or a coupling agent in addition to the aforementioned components. The amount of the additive is not particularly limited, and may be controlled within an appropriate range wherein the additive does not cause an adverse effect on the photosensitive composition and the pattern obtained therefrom.

The light diffusing agent may increase a refractive index of the composition in order to increase a chance of the incident light to meet with quantum dots. The light diffusing agent may include inorganic oxide particles such as alumina, silica, zirconia, titanium oxide particulates, or zinc oxide, and metal particles such as gold, silver, copper, or platinum, but is not limited thereto.

The leveling agent is aimed to prevent stains or spots and to improve planarization and leveling characteristics of a film, and examples thereof may include the following but are not limited thereto.

A fluorine-based leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent is aimed to increase adherence with respect to the substrate and examples thereof may include a silane-based coupling agent. Examples of the silane-based coupling agent include vinyl trimethoxysilane, vinyl tris(2-methoxyethoxysilane), 3-glycidoxypropyl trimethoxysilane, 2-(3,4-epoxy cyclohexyl)ethyl trimethoxysilane, 3-chloropropyl methyldimethoxysilane, 3-chloropropyl trimethoxysilane, 3-methacryloxylpropyl trimethoxysilane, 3-mercaptopropyl trimethoxysilane, and the like.

Amounts of each component in the composition are not particularly limited and may be adjusted as necessary. For example, the composition may include about 1 weight percent (wt %) to about 40 wt % of the quantum dot;

about 0.5 wt % to about 35 wt % of the carboxylic acid polymer;

about 0.5 wt % to about 30 wt % of the photopolymerizable compound;

optionally about 0.1 wt % to about 40 wt % of the thiol compound; and about 0.01 wt % to about 10 wt % of the photoinitiator; and a balance amount of the solvent based on a total weight of the composition, but is not limited thereto.

A content of the quantum dot including the organic ligand may be greater than or equal to about 1 wt %, for example, greater than or equal to about 5 wt %, or greater than or equal to about 10 wt % based on a total weight of the composition. A content of the quantum dot including the organic ligand may be less than or equal to about 40 wt %, for example, less than or equal to about 35 wt % based on a total weight of the composition. In an embodiment, a content of the quantum dot including the organic ligand may be about 1.5 wt % to about 60 wt % based on a total weight of solid contents (i.e., non-volatile components for example, the quantum dot polymer composite) of the composition.

The composition may further include the additive, and kinds and contents thereof may be controlled within an appropriate range wherein the additive does not cause an adverse effect on the composition and the pattern, are not particularly limited.

The composition may be coated on a transparent substrate by an appropriate manner (e.g., spin coating) to form a film. The formed film may be subjected to pre-baking as needed. The pre-baking may be performed at a temperature of less than or equal to about 120° C., for example, about 80° C. to about 120° C. A time of the pre-baking is not particularly limited and may be appropriately selected. For example, the pre-baking may be performed for greater than or equal to about 1 minute, greater than or equal to about 2 minutes, or greater than or equal to about 3 minutes and less than or equal to about 1 hour, less than or equal to about 50 minutes, less than or equal to about 40 minutes, less than or equal to about 30 minutes, less than or equal to about 20 minutes, less than or equal to about 10 minutes or less than or equal to about 5 minutes, but is not limited thereto. The pre-baking may be performed under a predetermined atmosphere (e.g., air, oxygen-free atmosphere, inert gas atmosphere), is not particularly limited thereto.

In the exposed region, cross-linking polymerization may occur to form a quantum dot polymer composite dispersed in the polymer matrix. The film is treated with an alkali aqueous solution to remove the unexposed region from the film and to obtain a pattern of the quantum dot polymer composite. The photosensitive composition may be developable by an alkali aqueous solution, and when the photosensitive composition is used, a pattern of the quantum dot-polymer composite pattern may be formed without using an organic solvent developing solution.

Figure 2:
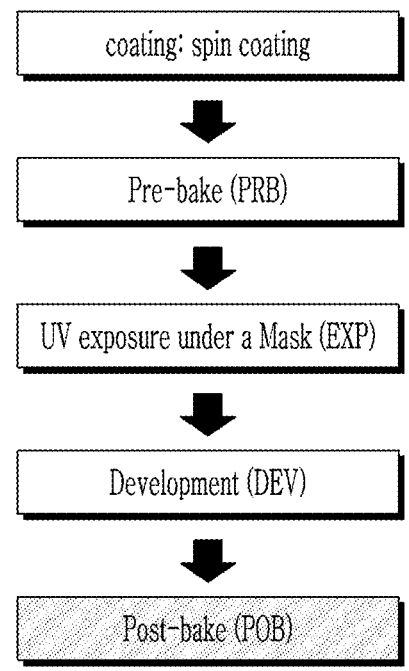
FIG. 2 shows an exemplary embodiment of a process for preparing a quantum dot-polymer composite.
Figure 2:

A non-limiting method of forming a pattern is explained referring to FIG. 2. The composition is coated on a predetermined substrate (e.g., a glass substrate or a glass substrate coated with a predetermined thickness of SiNx (protective layer) (e.g., about 500 Å to about 1500 Å of the protective layer)) in an appropriate manner such as spin coating or slit coating to form a film of a predetermined thickness (e.g., a thickness of about 3 micrometers (μm) to about 30 μm). The formed film may be pre-baked, if desired. The formed (or optionally pre-baked) film is exposed to light having a predetermined wavelength under a mask having a predetermined pattern. A wavelength and intensity of the light may be selected considering kinds and contents of the photoinitiator, kinds, and contents of the quantum dots, and the like.

The exposed film is treated (e.g., dipped or sprayed) with an alkali developing solution and thus an unexposed part of the film is dissolved to form the quantum dot polymer composite pattern.

An embodiment provides an electronic device including a quantum dot according to an embodiment. The electronic device may be a quantum dot light emitting diode ("QD LED"), an organic light emitting diode ("OLED"), a sensor, an image sensor, a solar cell electronic device, or a liquid crystal display ("LCD") device, but is not limited thereto.

A quantum dot according to an embodiment may be applied to an electronic device as the quantum dot polymer composite (e.g., as a quantum dot sheet). FIG. 1 shows a simplified stack structure of a liquid crystal display ("LCD") including the quantum dot sheet among these devices. The general structure of the liquid crystal display ("LCD") is well known, and FIG. 1 shows the simplified structure.

Figure 3:
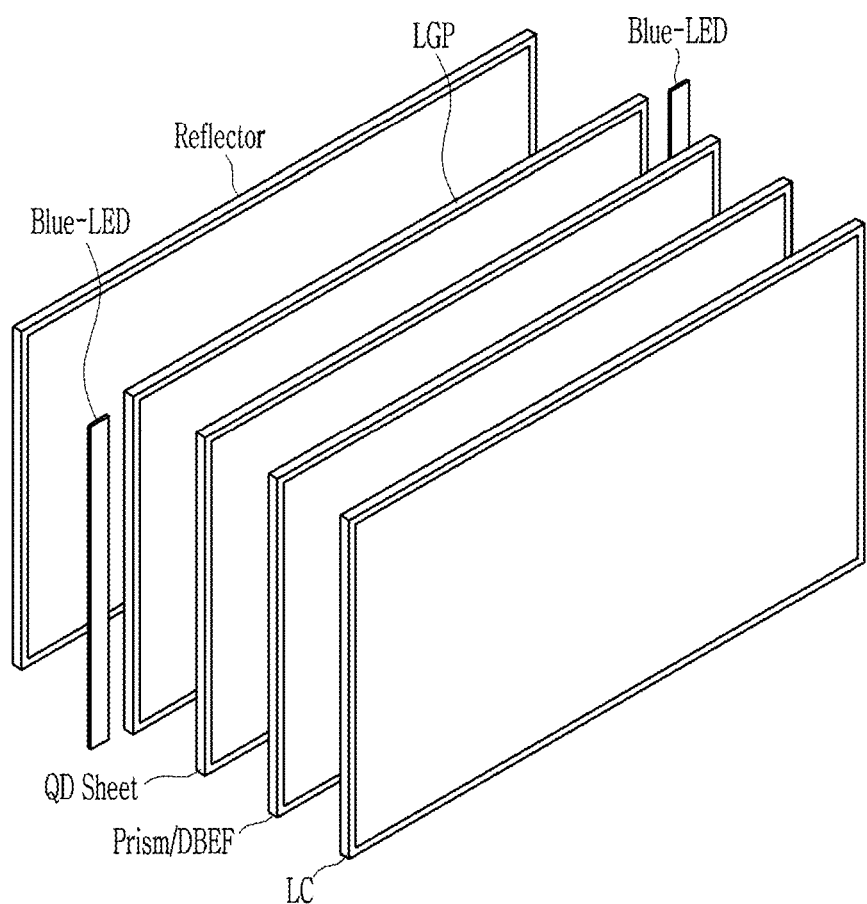
FIG. 3 is an exploded view showing an exemplary embodiment of an electronic device.

Referring to FIG. 3, the liquid crystal display may have a structure that a reflector, a light guide ("LGP") and a blue LED light source ("Blue-LED"), a quantum dot-polymer composite sheet ("QD sheet"), various optical films (e.g., a prism, and a double brightness enhance film ("DBEF") are stacked, and a liquid crystal panel is disposed thereon.

Figure 4:
FIG. 4 is a cross-sectional view showing an exemplary embodiment of an electronic device.

The quantum dot according to an embodiment may be used in an emissive layer of the quantum dot-containing electric field light emitting device (See: FIG. 4). The light emitting device may include an anode 1 and a cathode 5 facing each other; a quantum dot emission layer 3 including a plurality of quantum dots between the anode and the cathode; and a hole auxiliary layer 2 disposed between the anode and the quantum dot emission layer. The hole auxiliary layer may further include a hole injecting layer ("HIL"), a hole transporting layer ("HTL"), an electron blocking layer ("EBL"), or a combination thereof. The hole auxiliary layer may include any organic/inorganic material having hole characteristics. The quantum dot light emitting diode may further include an electron auxiliary layer 4 between the cathode and the quantum dot emission layer. The electron auxiliary layer may further include an electron injecting layer ("EIL"), an electron transporting layer ("ETL"), a hole blocking layer ('HBL"), or a combination thereof. The electron auxiliary layer may include any organic/inorganic material having electron characteristics.

Hereinafter, the embodiments are illustrated in more detail with reference to examples. However, they are example embodiments of the present invention, and the present invention is not limited thereto.

EXAMPLES

Analysis Method
[1] Light Emission Analysis and UV Spectrum Analysis

A photoluminescence analysis (at an excitation wavelength of 450 nm) and an UV spectrum analysis of a quantum dot-containing solution are performed by using an UV-vis spectrophotometer (Agilent CaryBio 5000) and a florescent spectrophotometer (Hitachi, F-7000) to obtain a PL spectrum and an UV-Vis absorption spectrum. A quantum yield, a full width at half maximum ("FWHM"), and an UV absorption wavelength of a quantum dot prepared therefrom are obtained therefrom.

[2] Photo-Conversion Efficiency.

A light conversion rate is a ratio of a light emission dose of a quantum dot-containing film relative to absorbed light dose from excited light (i.e., blue light). The total light dose (B) of excited light is obtained by integrating a PL spectrum, the PL spectrum of the quantum dot film (e.g., quantum dot-polymer composite film) is measured, a dose (A) of light in a green or red wavelength emitted from the quantum dot film and a dose (B') of blue light are obtained, and photo-conversion efficiency are obtained by the following equation:

$$A/(B-B')\times 100 = \text{photo-conversion efficiency (\%)}$$

A blue light conversion rate of a quantum dot-polymer composite film is obtained by inserting the quantum dot-polymer composite film between a light guide and an optical sheet of 60-inch TV equipped with blue LED having a peak wavelength of 449 nm. A photoluminescence spectrum is obtained by operating TV and analyzing light emitting characteristics with a spectroradiometer (Konica Minolta, CS-2000) about 45 centimeters (cm) apart from the front of TV. The photoluminescence spectrum is used to calculate the light conversion rate.

The quantum dot polymer composite film is prepared by the following process.

0.89 g of pentaerythritol tetrakis (3-mercaptopropionate) ("4T"), 0.61 g of 1,3,5-triallyl-1,3,5-triazine-2,4,6-trione ("TTT"), 0.03 g of Irgacure 754 are mixed to prepare a monomer mixture. The monomer mixture is defoamed under vacuum. The monomer mixture (1.5 g) is mixed with a quantum dot-including organic solution having a predetermined optical density (e.g., a concentration: (an absorption at 449 nm)×(a volume of a QD solution (milliliters (mL))) =3.75) and vortexed to obtain a composition, and the composition is vacuum-dried at room temperature for 1 hour to remove an organic solvent (e.g., chloroform) therein. 1 g of the composition is drop-cast on a PET film sputtered with a barrier (SiNx or SiOx, 0<x<2, I-Component Co., Ltd.). Another PET film is covered on the composition and UV-cured (light intensity: 100 milliwatts (mW)/cm$^2$) for 4 minutes to obtain a quantum dot-polymer composite film.

[3] Energy Dispersive X-Ray Spectroscopic Analysis

An XPS element analysis is performed by using Quantum 2000 made by Physical Electronics Inc. under a condition of an acceleration voltage: 0.5 to 15 kiloelectron volts (keV), 300 watts (W), a minimum analysis area: 200 um×200 um, and a sputter rate: 0.1 nm/minute.

[4] Inductively-coupled Plasma-Atomic Emission Spectroscopy (ICP-AES) Analysis

An inductively-coupled plasma-atomic emission spectroscopy analysis ("ICP-AES") is performed by using Shimadzu ICPS-8100.

[5] X-Ray Diffraction Analysis

An X-Ray Diffraction ("XRD") analysis is performed to examine a crystal structure of a quantum dot with power of 3 kilowatts (kW) by using Philips XPert PRO.

[6] Hole Transport ("HT") Measurement

HT is measured by measuring current density with Keithley 2400 source/m, while an electric field light emitting element is operated by applying a voltage of 0 to 10 V thereto, and then, recording current density (milliampere mA/cm$^2$) per unit area of one pixel of the light emitting element to which a voltage of 5 V is applied.

Quantum Dot Synthesis

Reference Example: Preparation of InP Core 0.2 millimoles (mmol) of indium acetate, 0.6 mmol of palmitic acid, and 10 mL of 1-octadecene are put in a reactor and heated at 120° C. under vacuum. After 1 hour, an atmosphere in the reactor is converted into nitrogen. The reactor is heated at 280° C., a mixed solution of tris (trimethylsilyl)phosphine ("TMS3P," 0.1 mmol) and trioctylphosphine (0.5 mL) is rapidly injected thereinto, and the mixture is reacted for 20 minutes. Subsequently, acetone is added to the reaction solution rapidly cooled down to room temperature, and a precipitate obtained by centrifuging the mixture is dispersed in toluene. The obtained InP semiconductor nanocrystal shows a UV first absorption maximum wavelength ranging from 420 nm to 600 nm.

Example 1

An organic solution (a concentration: 250 mmol/liter (L)) is obtained by dissolving tetrabutylammonium hexafluorophosphate ("TBAPF") in acetone.

On the other hand, 1.2 mmoL (0.224 g) of zinc acetate, 2.4 mmol (0.757 g) of oleic acid, and 10 mL of trioctylamine are put in a reaction flask and vacuum-treated at 120° C. for 10 minutes. The reaction flask is substituted with the nitrogen (N$_2$), and then is heated to 280° C. The toluene dispersion of InP semiconductor nanocrystals according to Reference Example (OD=optical density of 1$^{st}$ excitonic absorption, OD: 0.15, or 1 ml of a 1 wt % toluene solution) is put in the flask within 10 seconds, 2.4 mmol of S-TOP is added thereto, and the mixture is reacted for 30 minutes.

At a reaction solution temperature of 280° C., the organic solution of the ammonium fluorinated salt is injected thereto by using a syringe, and the mixture is reacted at the same temperature for 60 minutes (hereinafter, referred to be an ammonium fluorinated salt treatment).

Figure 6:
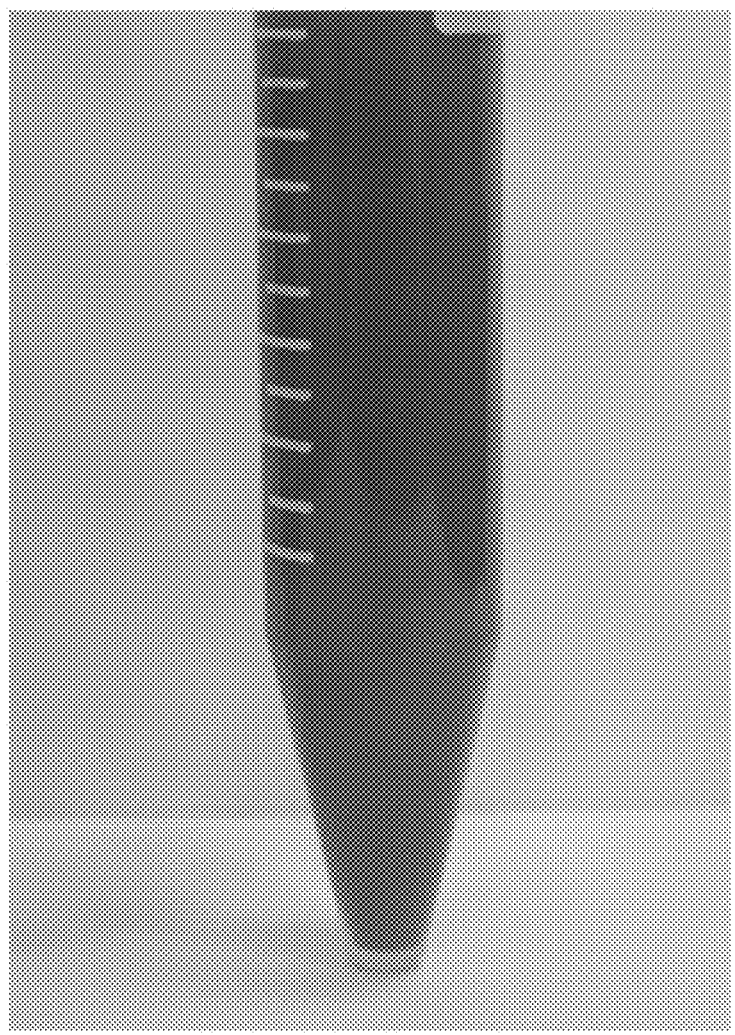
FIG. 6 is a photograph showing a reaction solution after synthesis of the quantum dot in Example 1.

Then the reaction is complete, and the reaction solution is rapidly cooled to room temperature. FIG. 6 is a photograph showing the cooled reaction solution. FIG. 6 confirms that no phase-separation occurs in the reaction solution upon completion of the reaction. Ethanol is added to the reaction solution at room temperature to form a precipitate, which is then centrifuged to obtain quantum dots. The quantum dots are redispersed in chloroform. With respect to the obtained quantum dots, photoluminescence-analysis is made and the results are shown in Table 1.

The quantum dot chloroform dispersion is used to form a quantum dot polymer composite film, and photo-conversion efficiency ("C.E.") of the quantum dot polymer composite film is measured. The results are compiled in Table 1.

Figure 5A:
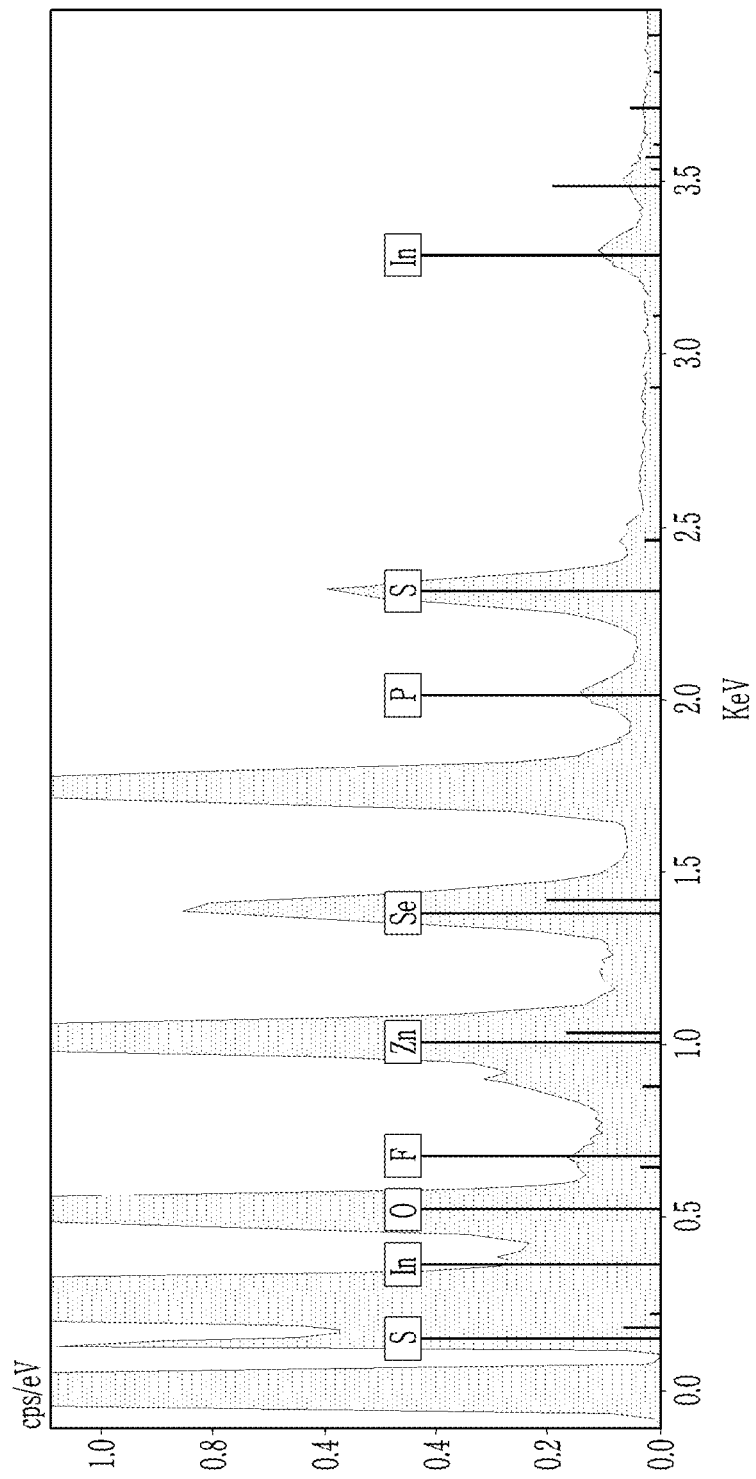
FIG. 5A shows energy dispersive X ray spectroscopic results of the quantum dot synthesized in Example 1.
Figure 5B:
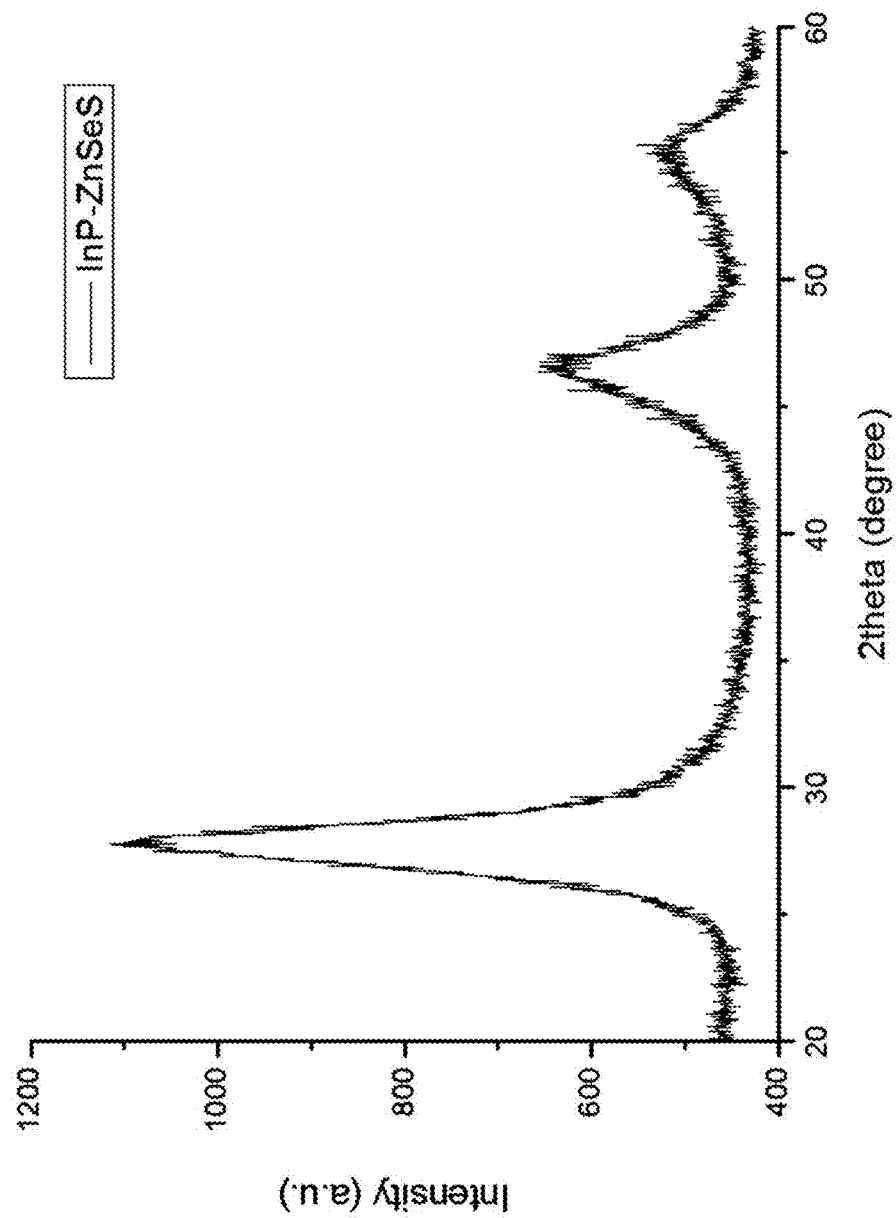
FIG. 5B shows X-ray diffraction analysis results of the quantum dot synthesized in Example 1.

An energy dispersive spectroscopy ("EDX") analysis of the quantum dots is performed, and the results are shown in FIG. 5A. Referring to FIG. 5A, the quantum dots of Example 1 turn out to include fluorine and phosphorus.

An X-ray diffraction analysis of the quantum dots is performed. The quantum dots turn out to have an InP/ZnSeS crystal structure.

Example 2

Quantum dots are obtained in the same manner as Example 1 except for setting the reaction solution at 280° C., injecting the ammonium fluorinated salt organic solution and an isopropanol solution of zirconium (IV) isopropoxide salt into the reaction solution, and further reacting the mixture at the same temperature for 60 minutes. A photoluminescence analysis of the quantum dots is performed, and the results are shown in Table 1.

The quantum dot chloroform dispersion is used to form a quantum dot film by spin coating. Photo-conversion efficiency ("C.E.") of the quantum dot film is measured, and the results are shown in Table 1.

Example 3

Quantum dots are obtained in the same manner as Example 1 except for setting the reaction solution at 280° C., injecting the ammonium fluorinated salt organic solution and a toluene solution of an aluminum (III) acetylacetonate salt into the reaction solution, and further reacting the mixture at the same temperature for 60 minutes.

Comparative Example 1

Quantum dots are obtained in the same manner as Example 1 except performing no ammonium fluorinated salt treatment. A photoluminescence analysis of the quantum dots is performed, and the results are compiled in Table 1.

The quantum dot chloroform dispersion is used to form a quantum dot film by spin coating. Photo-conversion efficiency ("C.E.") of the quantum dot polymer composite film is measured, and the results are compiled in Table 1.

Comparative Example 2

Figure 7:
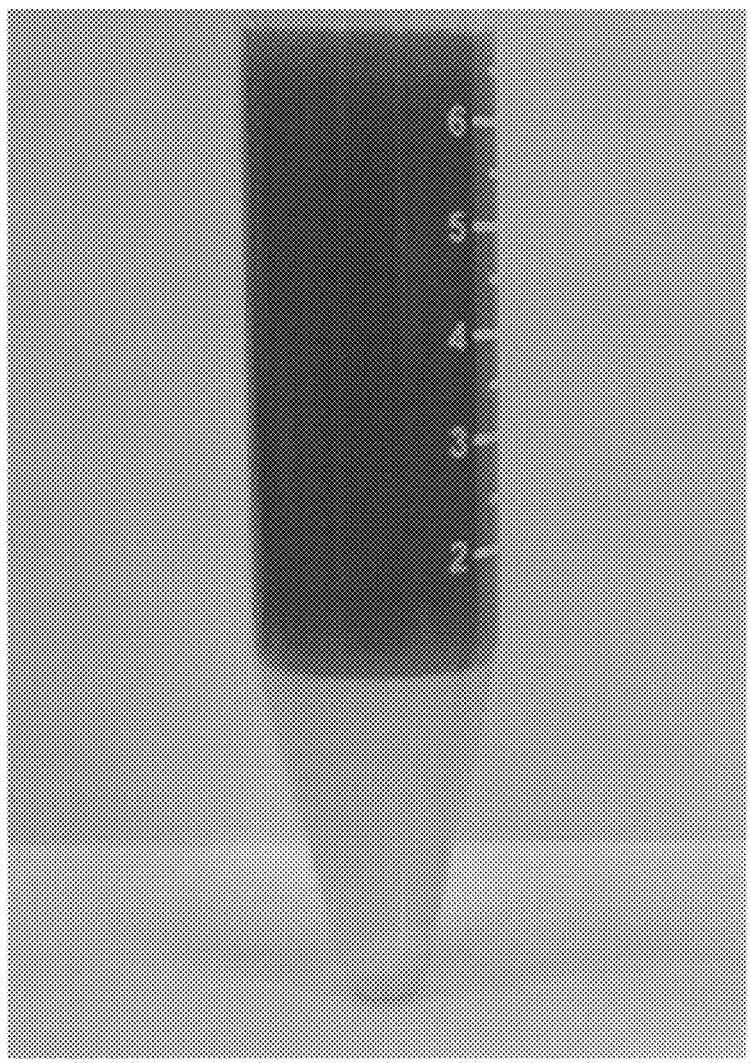
FIG. 7 is a photograph showing a reaction solution after synthesis of the quantum dot in Comparative Example 3.

Quantum dots are obtained in the same manner as Example 1 except for injecting butylmethylimidazolium tetrafluoroborate of an ionic liquid instead of the tetrabutylammonium hexafluorophosphate ("TBAPF") in a concentration of 3 millimolar (mM) into the reaction solution and using the obtained mixture for an ammonium fluorinated salt treatment. When the reaction is complete, the reaction solution is rapidly cooled down to room temperature. FIG. 7 is a photograph showing the cooled reaction solution. Referring to FIG. 7, when the reaction is complete, a phase-separation occurs in the reaction solution, and accordingly, a phase in a lower layer turns out to be formed due to use of the ionic liquid. A photoluminescence analysis of the quantum dots is performed, and the results are compiled in Table 1. The quantum dot chloroform dispersion is used to form a quantum dot film by spin coating. Photo-conversion efficiency ("C.E.") of the film is measured and then, the results are compiled in Table 1.

Comparative Example 3

Quantum dots are obtained in the same manner as Example 1 except for injecting butylmethylimidazolium tetrafluoroborate of an ionic liquid instead of the tetrabutylammonium hexafluorophosphate ("TBAPF") in a concentration of 210 mM into the reaction solution and using the obtained mixture for an ammonium fluorinated salt treatment. When the reaction was complete, the reaction solution is rapidly cooled down to room temperature. After completing the reaction, a phase-separation occurs in the reaction solution, and thus a phase turns out to be formed due to use of the ionic liquid. An UV-Vis spectrum analysis and a photoluminescence analysis of the quantum dots are performed, and the results are compiled in Table 1.

The quantum dot chloroform dispersion is used to form a quantum dot film by spin coating. Photo-conversion efficiency ("C.E.") of the film is measured and then, the results are compiled in Table 1.

TABLE 1

| | Relative injection amount of salt during salt treatment | Wavelength of photoluminescent peak ($\lambda$max) (nm) | FWHM (nm) | Photo-Luminescent Quantum Yield ("PLQY") (%) | FILM C.E. (%) |
|---|---|---|---|---|---|
| Comparative Example 1 | None | 621 | 41 | 76 | 44.1 |
| Example 1 | [TBAPF] = 0.3 mmol | 622 | 42 | 84 | 53.6 |
| Example 2 | [TBAPF] = 0.3 mmol [Zr(IV)] = 0.5 mmol | 621 | 41 | 85 | 53.2 |
| Comparative Example 2 | [BMIM] = 0.3 mmol | 622 | 42 | 78 | 46.2 |
| Comparative Example 3 | [BMIM] = 21 mmol | 623 | 42 | 84 | 52.8 |

The results of Table 1 confirm that the quantum dots according to Examples 1 and 2 may show significantly improved luminous efficiency compared with the quantum dots of Comparative Example 1 prepared with no salt treatment. It is also confirmed that the quantum dots of Examples 1 and 2 may have improved luminous efficiency even when a much smaller amount of the ammonium fluorinated salt is used than the production of the quantum dots in Comparative Example 3 using the ionic liquid.

An ICP-AES analysis of the quantum dots according to Examples 1 and 2 is performed, and the results are shown in Table 2.

TABLE 2

| | | Mole Ratios | | | | | |
|---|---|---|---|---|---|---|---|
| Samples | | P | S | Zn | Se | In | Zr |
| Example 1 | TBAPF$_6$ | 0.055 | 0.233 | 0.506 | 0.2 | 0.027 | — |
| Example 2 | TBAPF$_6$ + Zr (IV) | 0.065 | 0.179 | 0.533 | 0.239 | 0.033 | 0.004 |

Referring to Table 2, the quantum dots of the examples include a high amount of phosphorus (P) with respect to the amount of the indium atom. The results of Table 2 confirm that the quantum dots of Example 2 further include zirconium.

Synthesis of Quantum Dot Polymer Composite

Example 4

(1) Chloroform dispersion of a red light emitting quantum dot prepared in Example 1 is mixed with a binder polymer (a four-monomer copolymer of methacrylic acid, benzyl methacrylate, hydroxyethyl methacrylate and styrene, an acid value: 130 mg KOH/g, a number average molecular weight: 8000 grams per mole ("g/mol", methacrylic acid:benzylmethacrylate:hydroxyethylmethacrylate:styrene (a mole ratio)=61.5%:12%:16.3%:10.2%) solution (polypropylene glycol monomethyl ether acetate having a concentration of 30 wt %) to obtain a quantum dot-binder dispersion. Glycol di-3-mercaptopropionate as a photopolymerizable compound, a hexaacrylate having the following structure, and an oxime ester compound as an initiator are mixed with the quantum dot-binder dispersion to prepare a quantum dot-photosensitive composition (hereinafter, QD/PR).

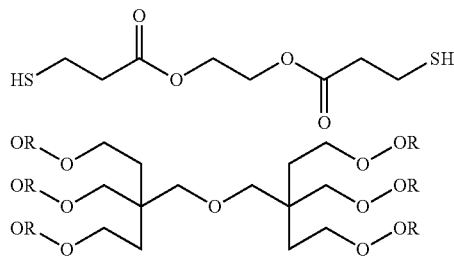

wherein

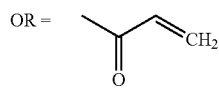

(2) The composition is coated on a glass substrate, pre-baked at 100° C. for 2 minutes, exposed to UV for 1 second (a wavelength: 365 nm, 60 mJ), and post-baked at 180° C. for 30 minutes to form a quantum dot-polymer composite film. A (blue) light conversion rate of the film after the pre-baking and the post-baking is measured, and the results are compiled in Table 2.

Example 5

A quantum dot-polymer composite film is obtained in the same manner as Example 4 except for using a chloroform dispersion of the red light emitting quantum dot according to Example 2 instead of a chloroform dispersion of the red light emitting quantum dot according to Example 1. A (blue) light conversion rate of the film after the pre-baking and the post-baking is measured, and the results are compiled in Table 2.

Example 6

A quantum dot-polymer composite film is obtained in the same manner as Example 4 except for using a chloroform dispersion of the red light emitting quantum dot according to Example 3 instead of a chloroform dispersion of the red light emitting quantum dot according to Example 1. A (blue) light conversion rate of the film after the pre-baking and the post-baking is measured, and the results are compiled in Table 2.

Comparative Example 4

A quantum dot-polymer composite film is obtained in the same manner as Example 4 except for using a chloroform dispersion of the red light emitting quantum dot according to Comparative Example 3 instead of a chloroform dispersion of the red light emitting quantum dot according to Example 1. A (blue) light conversion rate (conversion efficiency, "C.E.") of the film after the pre-baking ("PRB") and the post-baking ("POB") is measured, and the results are compiled in Table 3.

TABLE 3

|  | Comparative Example 4 | Example 4 | Example 6 | Example 5 |
|---|---|---|---|---|
| PRB C.E. | 41.6% | 42.8% | 42.9% | 41.6% |
| POB C.E. | 30.0% | 35.0% | 35.4% | 34.8% |
| Maintenance ratio = POB C.E./PRB C.E. | 72% | 81% | 82% | 83% |

The results of Table 3 confirm that the quantum dot polymer composites according to Examples 4 to 6 may show greatly improved thermal stability compared with the quantum dot polymer composite of Comparative Example 4.

Quantum Dot Light Emitting Diode

Examples 7-1 and 7-2

Figure 8:
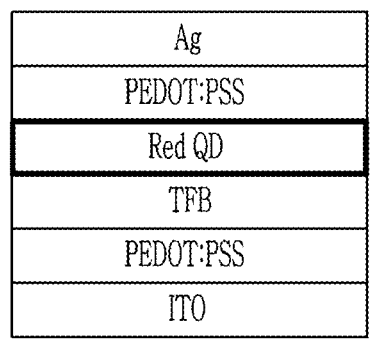
FIG. 8 schematically shows the cross sections of quantum dot light emitting diodes according to Examples 7-1 and 7-2 and Comparative Examples 5-1 and 5-2.

The quantum dots of Example 1 are used to manufacture a device shown in FIG. 8. Indium tin oxide ("ITO") is deposited on a substrate, and a poly(3,4-ethylenedioxythiophene):polystyrene sulfonate ("PEDOT:PSS") layer and a poly[(9,9-dioctylfluorenyl-2,7-diyl)-co-(4,4'-(N-(4-sec-butylphenyl)diphenylamine)] ("TFB") layer are formed thereon by spin-coating. On the TFB layer, a quantum dot layer is formed via a spin-coating, is subjected to a ligand exchange process with dodecanethiol in a dip coating manner, and then is heat-treated for 5 minutes under a nitrogen atmosphere at 80° C. (Example 7-1) and 180° C. (Example 7-2), respectively.

On the heat-treated quantum dot layer, a molybdenum oxide ($MoO_3$) layer is vacuum-deposited. On the $MoO_3$ layer, an Ag electrode is formed by a vacuum deposition.

While 5V of a voltage is applied between the ITO electrode and the Ag electrode to operate a device, hole transport is measured. The results are shown in Table 4.

Comparative Examples 5-1 and 5-2

Devices of Comparative Examples 5-1 and 5-2 are respectively manufactured in the same manner as Examples 7-1 and 7-2 except for using the quantum dots of Comparative Example 3. While 5V of a voltage is applied between the ITO electrode and the Ag electrode to operate a device, hole transport ("HT") is measured. The results are shown in Table 4.

TABLE 4

| | Comparative Example 5-1 | Comparative Example 5-2 | Example 7-1 | Example 7-2 |
|---|---|---|---|---|
| HT (mA/cm$^2$) | 0.038 | 0.016 | 0.091 | 0.065 |

Referring to the results of Table 4, the electronic devices of the Examples show a remarkably high hole transport compared with the electronic device of Comparative Example.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A process for preparing a quantum dot having a core-shell structure, the process comprising:
    obtaining a first mixture comprising a first precursor comprising a first metal, a ligand compound, and a solvent;
    adding a second precursor and a particle comprising a first semiconductor nanocrystal to the first mixture to obtain a second mixture; and
    heating the second mixture up to a reaction temperature to cause a reaction between the first precursor and the second precursor and form a layer of a shell comprising a crystalline or amorphous material,
    wherein the process comprises adding an organic solution comprising an ammonium fluorinated salt and optionally a metal salt to the second mixture during formation of the layer of the shell or after formation of the layer of the shell,
    the ammonium fluorinated salt comprises a solid salt having a melting point of greater than or equal to about 110° C.,
    the optional metal salt comprises a transition metal that is different from the first metal of the first precursor, and
    wherein the ammonium fluorinated salt comprises an ammonium cation and a fluorinated anion.

2. The process of claim 1, wherein:
    the first semiconductor nanocrystal comprises a Group II-VI compound, a Group III-V compound, a Group IV-VI compound, a Group IV element or compound, a Group compound, a Group I-II-IV-VI compound, or a combination thereof, and
    the crystalline or amorphous material comprises a Group II-VI compound, a Group III-V compound, a Group IV-VI compound, a Group IV compound, a metal-containing halogen compound, a metal oxide, or a combination thereof.

3. The process of claim 1, wherein:
    the first precursor comprises a Group II metal, a Group III metal, a Group IV metal, or a combination thereof, and comprises a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof, and
    the second precursor comprises a Group V element or a compound comprising the same, a Group VI element or a compound comprising the same, a halogen-containing compound, or a combination thereof.

4. The process of claim 1, wherein the ligand compound comprises RCOOH, RNH$_2$, R$_2$NH, R$_3$N, RSH, R$_3$PO, R$_3$P, ROH, RCOOR', RPO(OH)$_2$, R$_2$POOH (wherein, R and R' are the same or different, and are independently a substituted or unsubstituted C1 to C24 aliphatic hydrocarbon group or a substituted or unsubstituted C6 to C20 aromatic hydrocarbon group, or a combination thereof.

5. The process of claim 1, wherein the method further comprises heating the first mixture up to a temperature that is lower than the reaction temperature.

6. The process of claim 1, wherein the organic solution is added to the second mixture at a temperature that is lower than the reaction temperature.

7. The process of claim 1, wherein the ammonium fluorinated salt is represented by Chemical Formula 1:

Chemical Formula 1

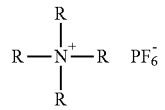

wherein, each R is the same or different and is independently a C1 to C16 aliphatic hydrocarbon group or a C6 to C20 aromatic hydrocarbon group, and optionally at least two of the R are linked with each other to form a ring.

8. The process of claim 7, wherein the ammonium fluorinated salt comprises a symmetric tetraalkyl ammonium salt, an asymmetric tetraalkylammonium salt, an aryltrialkyl ammonium salt, or a combination thereof.

9. The process of claim 7, wherein the ammonium fluorinated salt comprises tetramethylammonium hexafluorophosphate, tetraethylammonium hexafluorophosphate, tetrapropylammonium hexafluorophosphate, tetrabutylammonium hexafluorophosphate, tetrahexylammonium hexafluorophosphate, ethyltrimethylammonium hexafluorophosphate, benzyltrimethylammonium hexafluorophosphate, dodecyltrimethylammonium hexafluorophosphate, hexadecyltrimethylammonium hexafluorophosphate, or combination thereof.

10. The process of claim 1, wherein an amount of the ammonium fluorinated salt is about 0.0001 mole to about 100 moles with respect to one mole of the first precursor.

11. The process of claim 1, wherein the metal salt comprises a compound represented by Chemical Formula 2:

M$^+$X$^-$  Chemical Formula 2 wherein, M is zirconium, hafnium, aluminum, or a combination thereof, X is a C1 to C10 alkoxide, RCOCH$_2$COR$^-$ (wherein, each R is the same or different and is independently a C1 to C10 aliphatic hydrocarbon group or a C6 to C20 aromatic hydrocarbon group), or a C1 to C18 carboxylate.

12. The process of claim 11, wherein the organic solution comprises a C3 to C12 ketone, a C1 to C24 amine, a C1 to C12 alcohol, a C4 to C9 nitrogen-containing heterocyclic compound, a C6 to C18 substituted or unsubstituted aliphatic hydrocarbon, a C6 to C14 substituted or unsubstituted aromatic hydrocarbon, a C2 to C8 nitrile, or a combination thereof.

13. The process of claim 11, wherein an amount of the metal salt is about 0.0001 mole to about 100 moles with respect to one mole of the first precursor.

14. The process of claim 1, wherein the forming of the layer of the shell is performed at least twice to form a multi-layered shell comprising at least two layers and the first precursor, the second precursor, the ammonium fluorinated salt, the metal salt, or a combination thereof are changed during formation of each layer so that two adjacent layers have different compositions.

15. The process of claim 14, wherein the organic solution is added to the second mixture during formation of an outermost layer.

16. The process of claim 1, wherein the ammonium fluorinated salt comprises an alkyl ammonium fluorophosphate.

17. The process of claim 1, wherein the ammonium fluorinated salt comprises a fluorophosphate.

18. A quantum dot comprising:
a core comprising a first semiconductor nanocrystal; and
a shell disposed on the core and comprising a crystalline or amorphous material,
wherein the shell comprises phosphorus, fluorine, and optionally a transition metal,
the transition metal comprises zirconium, hafnium, aluminum, or a combination thereof,
the phosphorus and the transition metal are present as being doped, and
the fluorine is present as being doped or in a form of a fluoride.

19. The quantum dot of claim 18, wherein:
the first semiconductor nanocrystal comprises a Group II metal, a Group III metal, a Group IV metal, or a combination thereof, and
the crystalline or amorphous material comprises a Group I metal, a Group II metal, a Group III metal, a Group IV metal, or a combination thereof, provided that the crystalline or amorphous material comprises a Group metal that is different from the metal of the first semiconductor nanocrystal.

20. The quantum dot of claim 18, wherein the phosphorus, the fluorine, and optionally the transition metal are bound to a surface of the quantum dot and the quantum dot does not exhibit crystalline peaks arising from the phosphorus, the fluorine, and optionally the transition metal in an X-ray diffraction analysis of the quantum dot.

21. The quantum dot of claim 18, wherein:
the quantum dot comprises a ligand compound on a surface of the quantum dot; and
the ligand compound comprises RCOOH, $RNH_2$, $R_2NH$, $R_3N$, RSH, $R_3PO$, $R_3P$, ROH, RCOOR', $RPO(OH)_2$, $R_2POOH$ (wherein, R and R' are the same or different, and are independently substituted or unsubstituted C1 to C24 aliphatic hydrocarbon group or a substituted or unsubstituted C6 to C20 aromatic hydrocarbon group), or a combination thereof.

22. A quantum dot-polymer composite comprising:
a polymer matrix; and
the quantum dot of claim 18 dispersed in the polymer matrix.

23. An electronic device comprising the quantum dot of claim 18.

24. The electronic device of claim 23, wherein the electronic device comprises a quantum dot light emitting diode, an organic light emitting diode, a sensor, a solar cell, an image sensor, or a liquid crystal display.

* * * * *